United States Patent
Shim et al.

(10) Patent No.: US 8,637,920 B2
(45) Date of Patent: Jan. 28, 2014

(54) SEMICONDUCTOR MEMORY DEVICES HAVING SELECTION TRANSISTORS WITH NONUNIFORM THRESHOLD VOLTAGE CHARACTERISTICS

(71) Applicant: Samsung Electronics Co., Ltd., Suwon-si (KR)

(72) Inventors: Sunil Shim, Seoul (KR); Jaehun Jeong, Hwaseong-si (KR); Hansoo Kim, Suwon-si (KR); Sunghoi Hur, Seoul (KR); Jaehoon Jang, Seongnam-si (KR); Su-Youn Yi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/684,857

(22) Filed: Nov. 26, 2012

(65) Prior Publication Data
US 2013/0075807 A1 Mar. 28, 2013

Related U.S. Application Data

(62) Division of application No. 12/698,542, filed on Feb. 2, 2010, now Pat. No. 8,319,275.

(30) Foreign Application Priority Data

Feb. 25, 2009 (KR) .................. 10-2009-0015937

(51) Int. Cl.
*H01L 29/792* (2006.01)
*H01L 29/66* (2006.01)

(52) U.S. Cl.
USPC ............ 257/324; 257/329; 257/392; 257/401

(58) Field of Classification Search
USPC .................. 257/324, 329, 392, 401
See application file for complete search history.

(56) References Cited

U.S. PATENT DOCUMENTS

| | | | |
|---|---|---|---|
| 6,744,083 B2 | 6/2004 | Chen et al. | 257/219 |
| 6,930,004 B2 | 8/2005 | Wang et al. | 438/268 |
| 7,696,559 B2 | 4/2010 | Arai et al. | 257/316 |
| 8,319,275 B2 * | 11/2012 | Shim et al. | 257/324 |
| 2003/0116792 A1 | 6/2003 | Chen et al. | 257/220 |
| 2003/0122184 A1 | 7/2003 | Park | |
| 2003/0168687 A1 | 9/2003 | Chidambarrao et al. | 257/300 |
| 2004/0171198 A1 | 9/2004 | Zeng | 438/142 |
| 2005/0037561 A1 | 2/2005 | Wang et al. | 438/238 |
| 2005/0226047 A1 | 10/2005 | Hieda et al. | 365/185.14 |
| 2005/0272208 A1 | 12/2005 | Zeng | 438/268 |
| 2006/0186446 A1 | 8/2006 | Kim et al. | |
| 2008/0023759 A1 | 1/2008 | Zeng | 257/334 |
| 2008/0087940 A1 | 4/2008 | Chae et al. | 257/324 |
| 2008/0179659 A1 | 7/2008 | Enda et al. | |
| 2008/0305598 A1 | 12/2008 | Horsky et al. | 438/303 |
| 2010/0099231 A1 | 4/2010 | Siprak | 438/299 |
| 2010/0159657 A1 | 6/2010 | Arai et al. | 438/268 |
| 2010/0264425 A1 | 10/2010 | Miller et al. | 257/76 |
| 2011/0092033 A1 | 4/2011 | Arai et al. | 438/152 |

FOREIGN PATENT DOCUMENTS

| | | |
|---|---|---|
| JP | 06-338602 | 12/1994 |
| JP | 10-032269 | 3/1998 |
| JP | 10-093083 | 4/1998 |

* cited by examiner

*Primary Examiner* — Ngan Ngo
(74) *Attorney, Agent, or Firm* — Myers Bigel Sibley & Sajovec PA

(57) ABSTRACT

Provided is a semiconductor memory device. In the semiconductor memory device, a lower selection gate controls a first channel region that is defined at a semiconductor substrate and a second channel region that is defined at the lower portion of an active pattern disposed on the semiconductor substrate. The first threshold voltage of the first channel region is different from the second threshold voltage of the second channel region.

10 Claims, 27 Drawing Sheets

SEMICONDUCTOR MEMORY DEVICES HAVING SELECTION TRANSISTORS WITH NONUNIFORM THRESHOLD VOLTAGE CHARACTERISTICS

REFERENCE TO PRIORITY APPLICATIONS

This application is a divisional of U.S. patent application Ser. No. 12/698,542, filed Feb. 2, 2010, now U.S. Pat. No. 8,319,275, which claims priority to Korean Patent Application No. 10-2009-0015937, filed Feb. 25, 2009, the contents of which are hereby incorporated herein by reference.

FIELD OF THE INVENTION

The present invention relates to semiconductor devices, and more particularly, to semiconductor memory devices.

BACKGROUND

A semiconductor memory device in semiconductor devices may store digital data. As the electronic and semiconductor industries become highly sophisticated, the requirement for high-integration of semiconductor memory devices is gradually increasing. For example, as portable electronic devices such as laptop computers, mobile phones, digital cameras and MP3 players advance, requirements for semiconductor memory devices capable of storing more data are increasing. To satisfy these consumer requirements, highly integrated semiconductor memory devices are required.

Generally, the minimum line width of fine patterns constituting a semiconductor memory device may be decreased for higher integration of a semiconductor memory device. By two-dimensionally decreasing the minimum line width of the fine pattern, more memory cells may be integrated in a limited area.

However, due to various factors such as photolithography process parameters, the amount by which the minimum line width is decreased may be limited. Moreover, as the line widths of the fine patterns decrease, the characteristics of the fine patterns may be deteriorated, thereby reducing semiconductor memory device reliability. Accordingly, much research is actively being conducted in pursuit of new methods for implementing semiconductor memory devices that are highly integrated and have superior characteristics.

SUMMARY

Integrated circuit memory devices according to embodiments of the present invention include a transistor having a semiconductor channel region therein and a gate electrode extending opposite the semiconductor channel region. The transistor is configured to have a nonuniform threshold voltage characteristic along a length of the semiconductor channel region. To achieve this nonuniform threshold voltage, the semiconductor channel region may be nonuniformly doped and may be configured to have an L-shaped cross-section. In particular, the semiconductor channel region may include a first channel region segment extending opposite a sidewall of the gate electrode and a second channel region segment extending opposite a bottom of the gate electrode. This first channel region segment may be nonuniformly doped relative to the second channel region segment.

According to additional embodiments of the invention, a non-volatile memory device includes a vertical NAND-type string of non-volatile memory cells on a substrate. A lower string selection transistor is also provided. The lower string selection transistor extends between the vertical NAND-type string of non-volatile memory cells and the substrate. The lower string selection transistor has a semiconductor channel region therein and a gate electrode extending opposite the semiconductor channel region. The lower string selection transistor has a nonuniform threshold voltage characteristic along a length of the semiconductor channel region. This non-volatile memory device also includes a common source region of first conductivity type in the substrate. The common source region, which forms a P-N rectifying junction with the semiconductor channel region, extends opposite a sidewall of the gate electrode. In some of these embodiments of the invention, the semiconductor channel region is nonuniformly doped and has an L-shaped cross-section. In particular, the semiconductor channel region may include a first channel region segment extending opposite a sidewall of the gate electrode and a second channel region segment extending opposite a bottom of the gate electrode. This first channel region segment may be nonuniformly doped relative to the second channel region segment.

DETAILED DESCRIPTION OF THE EMBODIMENTS

Figure 1A:
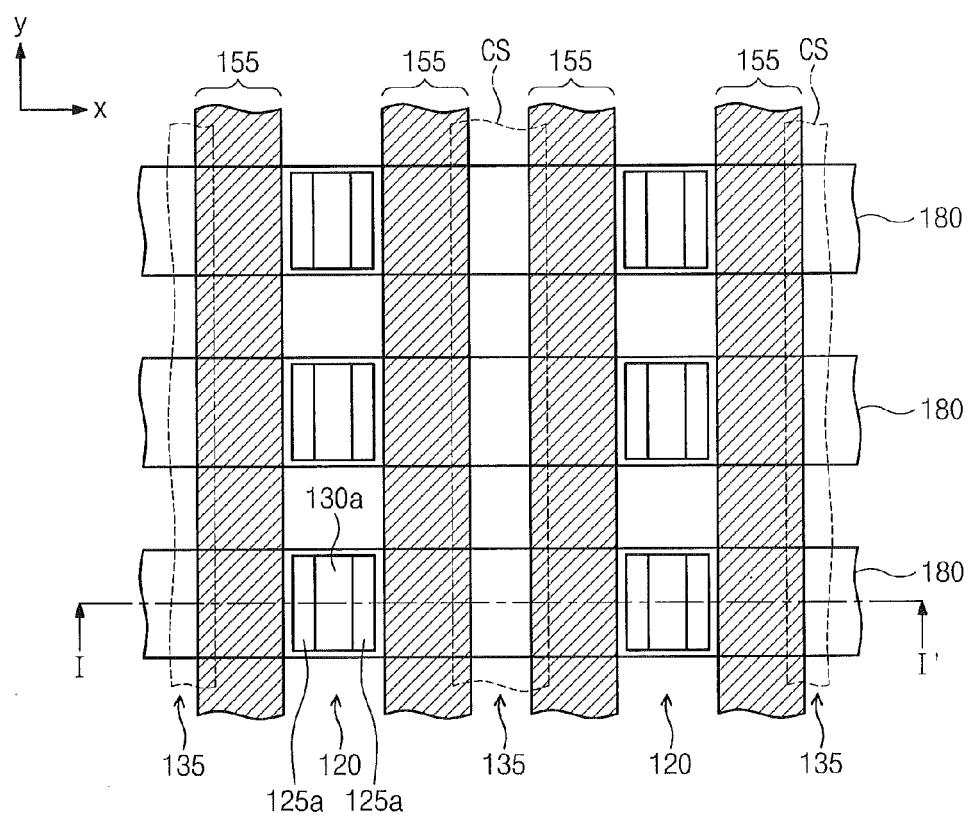
FIG. 1A is a plan view illustrating a semiconductor memory device according to an embodiment of the inventive concept.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Since preferred embodiments are provided below, the order of the reference numerals given in the description is not limited thereto. In the figures, the dimensions of layers and regions are exaggerated for clarity of illustration. Also, it will be understood that when a layer (or film) is referred to as being 'on' another layer or substrate, it can be directly on the other layer or substrate, or intervening layers may also be present. In the specification, the term 'and/or' is used as meaning in which the term includes at least one of preceding and succeeding elements.

First Embodiment

Figure 1B:
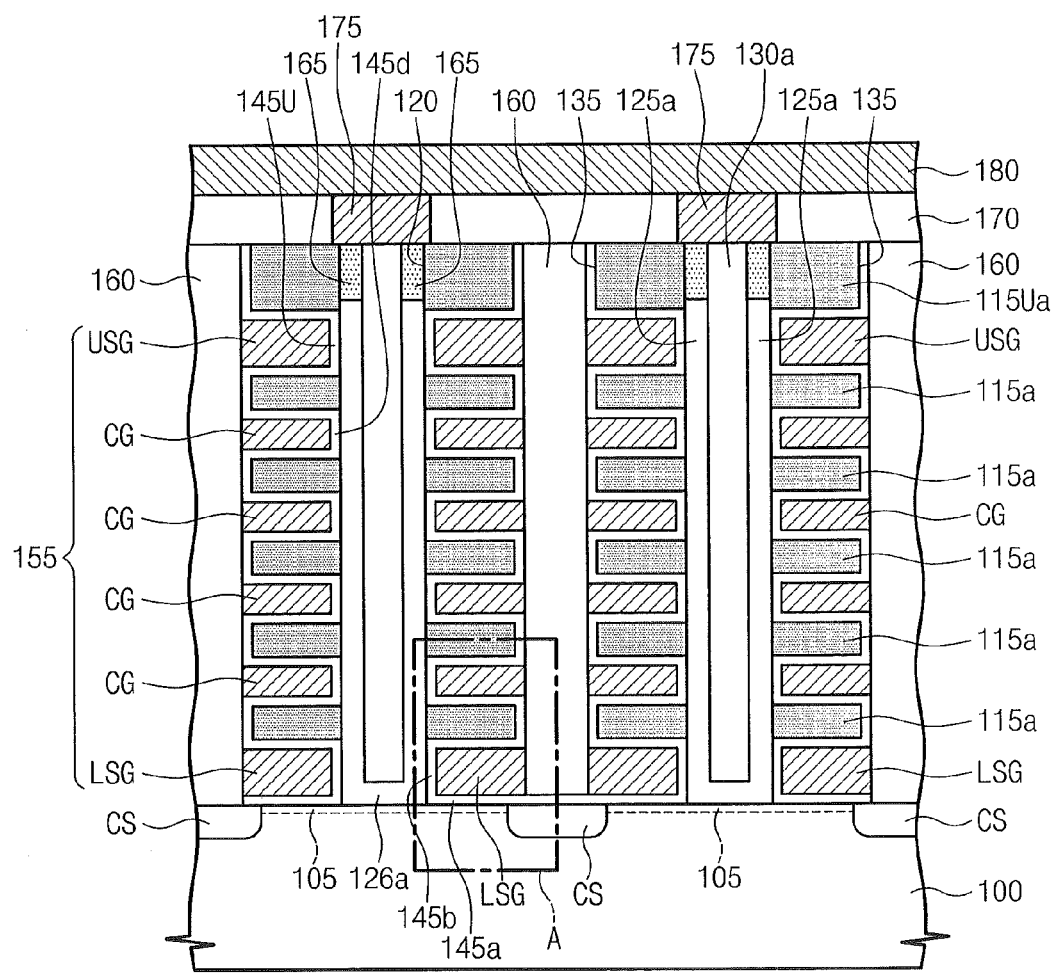
FIG. 1B is a cross-sectional view taken along line I-I' in FIG. 1A.
Figure 1C:
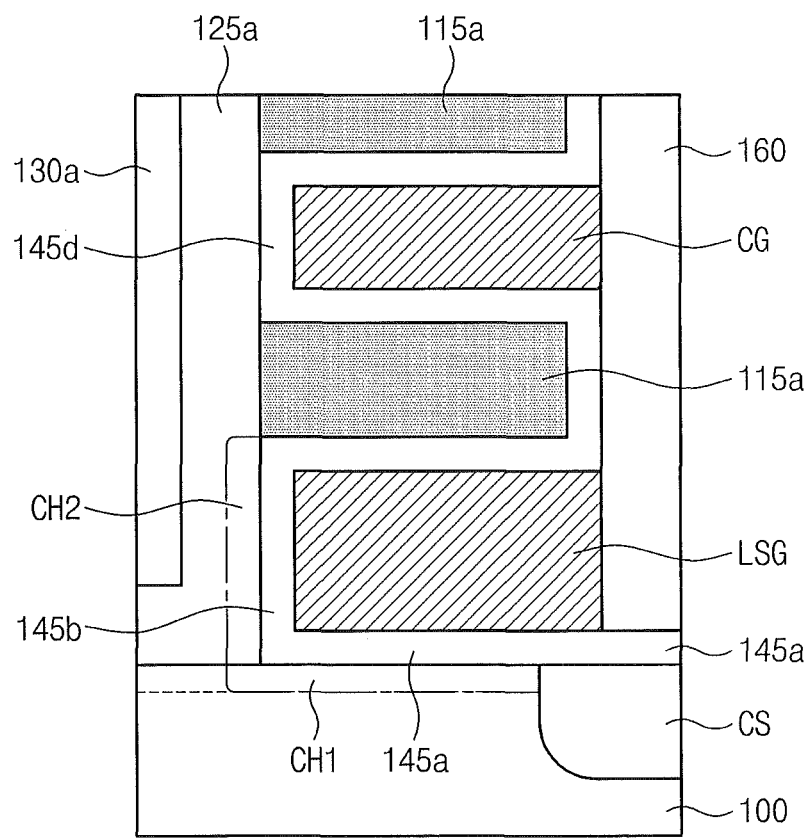
FIG. 1C is a diagram magnifying a portion A in FIG. 1B.

FIG. 1A is a plan view illustrating a semiconductor memory device according to an embodiment of the inventive concept. FIG. 1B is a cross-sectional view taken along line I-I' in FIG. 1B. FIG. 1C is a diagram magnifying a portion A in FIG. 1B.

Referring to FIGS. 1A through 1C, an active pattern 125a is disposed on a semiconductor substrate 100. The active pattern 125a is extended toward a direction far away from the semiconductor substrate 100. The semiconductor substrate 100 may be formed of periodic table group 4A element (or group 14 element). For example, the semiconductor substrate 100 may be a silicon substrate, a germanium substrate or a silicon-germanium substrate. The active pattern 125a may be formed of periodic table group 4A element (or group 14 element). As an example, the active pattern 125a may include at least one of silicon, germanium and silicon-germanium. The active pattern 125a may be formed of the same material as that of the semiconductor substrate 100. For example, the semiconductor substrate 100 may be a silicon substrate, and the active pattern 125a may be formed of silicon. The active pattern 125a may contact the semiconductor substrate 100. The semiconductor substrate 100 is doped with first conductive dopants. A well region doped with the first conductive dopant is formed in the semiconductor substrate 100 and thereby the semiconductor substrate 100 is doped with the first conductive dopant. For example, the semiconductor substrate 100 in FIG. 1B may be a well region. The active pattern 125a may be doped with the same dopant as that of the semiconductor substrate 100. That is, the active pattern 125a may be doped with the first conductive dopant. Unlike this, the active pattern 125a may not be doped with dopant. That is, the active pattern 125a may be in an intrinsic state.

A plurality of gates LSG, CG and USG and a plurality of dielectric patterns 115a and 115Ua are alternately stacked on the semiconductor substrate 100 of the one side of the active pattern 125a. A lowermost gate LSG of the plurality of gates LSG, CG and USG corresponds to a lower selection gate LSG, and an uppermost gate USG of the plurality of gates LSG, CG and USG corresponds to an upper selection gate USG. Gates CG between the lower selection gate LSG and the upper selection gate USG correspond to cell gates CG. Inter-gate dielectric patterns 115a may be disposed between a lower selection gate LSG and a cell gate CG adjacent to the lower selection gate LSG, between cell gates CG adjacent to each other, and between the upper selection gate USG and a cell gate CG adjacent to the upper selection gate USG, respectively. That is, the gates LSG, CG and USG may be separated from each other by the inter-gate dielectric patterns 115a. The lower selection gate LSG has a one-sidewall adjacent to the active pattern 125a. The inter-gate dielectric patterns 115a and the cell gates CG, which are alternately stacked on the lower selection gate LSG, have one-sidewalls adjacent to the active pattern 125a. The upper selection gate USG and a capping dielectric pattern 115Ua, which are disposed on an uppermost inter-gate dielectric pattern of the inter-gate dielectric patterns 115a, have one-sidewalls adjacent to the active pattern 125a.

The gates LSG, CG and USG may be formed of conductive materials. For example, the gates LSG, CG and USG may include at least one of doped periodic table group 4A element (for example, doped silicon, doped germanium and doped silicon-germanium), metals (for example, tungsten, titanium, tantalum and aluminum), conductive metal nitrides (for example, nitride titanium and nitride tantalum), metal-group 4A element compounds (for example, tungsten silicide, cobalt silicide and titanium silicide). The inter-gate dielectric pattern 115a and the capping dielectric pattern 115Ua may include at least one of oxide, a nitride, carbide and oxynitride.

The lower selection gate LSG, the cell gates CG and the upper selection gate USG that are stacked form one gate stack 155. The gate stack 155, as shown in FIG. 1A, may have a line shape in which it is extended in a first direction. That is, the gates LSG, CG and USG in the gate stack 155 may have line shapes in which they are extended along the first direction in parallel. The first direction is parallel to the upper surface of the semiconductor substrate 100. The first direction may be the y-axis direction in FIG. 1A. As illustrated in FIG. 1A, a plurality of gate stacks 155 may be extended in the first direction in parallel on the semiconductor substrate 100. The gate stacks 155 may be separated from each other in a second direction vertical to the first direction. The second direction corresponds to the x-axis direction in FIG. 1A and is parallel to the upper surface of the semiconductor substrate 100.

An opening 120 is defined between a pair of adjacent gate stacks 155. The opening 120 may have a groove shape that is extended in the first direction. The pair of gate stacks 155 may have a symmetric structure in which they are symmetrical with respect to the opening 120. The pair of gate stacks 155 of defining the opening 120 are defined as one gate stack group. A plurality of gate stack groups are disposed on the semiconductor substrate 100, and an isolation pattern 160 is disposed between a pair of adjacent gate stack groups. The isolation pattern 160 fills a trench 135 that is defined the pair of adjacent gate stack groups.

A pair of active patterns 125a, which are separated from each other in the second direction (i.e., the x-axis direction) and face each other in the opening 120, may be disposed. The pair of active patterns 125a facing each other are defined as an active pattern group. The active patterns 125a of the active pattern group are adjacent to the one-sidewalls of the gate stacks in the gate stack group, respectively. A first charge dielectric pattern 130a may be disposed between the pair of active patterns 125a of the active pattern group. The first charge dielectric pattern 130a may include at least one of oxide, nitride and oxynitride. The lower end portion of the active patterns 125a of the active pattern group may contact the both edges of an active bottom 126a, respectively. The active bottom 126a may be formed of the same material as that of the active pattern 125a. The active bottom 126a may contact the active patterns 125a without a boundary surface. According to an embodiment of the inventive concept, the active bottom 126a may be omitted. According to an embodiment of the inventive concept, the first charge dielectric pattern 130a may be omitted. In this case, the active patterns 125a of the active pattern group are extended and contact each other, forming a pillar shape.

A plurality of active pattern groups may be disposed in the opening 120. The active pattern groups in the opening 120 are arranged along the first direction (i.e., the y-axis direction) and are separated from each other. The opening 120 between the active pattern groups may be filled with a second charge dielectric pattern (168 in FIG. 3C). The second charge dielectric (168 in FIG. 3C) may include at least one of an oxide, a nitride and an oxynitride.

Referring to FIG. 1B, an upper selection gate dielectric layer 145U may be disposed between the upper selection gate USG and the active pattern 125a. A data storage layer 145d is disposed between each of the cell gates CG and each of the active patterns 125a. A first lower selection gate dielectric layer 145a may be disposed between the semiconductor substrate 100 and the lower selection gate LSG, and a second lower selection gate dielectric layer 145b may be disposed between the active pattern 125a and the lower selection gate LSG.

A lower selection transistor, a plurality of memory cells and an upper selection transistor are formed at one the active pattern 125a. One the memory cell may include a data storage layer 145d that is disposed at the cell gate CG and a portion of the active pattern 125a adjacent to the cell gate CG, and between these. The data storage layer 145d may include a charge trapping layer for storing electric charges. Furthermore, the data storage layer 145d may further include a tunnel dielectric layer between the charge trapping layer and the active pattern 125a, and a blocking dielectric layer between the charge trapping layer and the cell gate CG. The charge trapping layer may be formed of a material having traps for storing electric charges. For example, the charge trapping layer may include at least one of a nitride, an oxide, an insulator including nano dots and a metal nitride. The tunnel dielectric layer may include at least one of oxide (for example, a thermal oxide and a Chemical Vapor Deposition (CVD) oxide), nitride and oxynitride. The blocking dielectric layer may include at least one of silicon oxide and a high-K dielectric (for example, a metal oxide such as hafnium oxide and aluminum oxide, etc) having a dielectric constant higher than that of the tunnel dielectric layer. A memory cell having the data storage layer 145d may be a nonvolatile memory cell that maintains stored data although a power source is shut off.

At least one portion of the active pattern 125a next to the cell gate CG corresponds to the channel region of the memory cell. The upper selection transistor may include the upper selection gate USG, a portion of the active pattern 125a adjacent to the upper selection gate USG, and an upper selection gate dielectric layer 145U between these. At least one portion of the active pattern 125a next to the upper selection gate USG corresponds to the channel region of the upper selection transistor. The lower selection transistor may include the lower selection gate LSG, a portion of the active pattern 125a adjacent to the lower selection gate LSG, a portion of the semiconductor substrate 100 under the lower selection gate LSG, a first lower selection gate dielectric layers 145a, and a second lower selection gate dielectric layers 145b. The lower selection transistor includes a first channel region that is defined at the semiconductor substrate 100 under the lower selection gate LSG and a second channel region that is defined at the active pattern 125a next to the lower selection gate LSG. The lower selection transistor will be described below in detail. The thicknesses of the lower and upper selection gates ISG and USG may be thicker than that of the cell gate CG, and thus the channel length of the first channel region of the lower selection transistor and the channel length of the channel region of the upper selection transistor may greater than that of the channel region of the memory cell.

In the operation of the semiconductor memory device, inversion layers may be formed at the active pattern 125a next to the inter-gate dielectric patterns 115a. When an operation voltage is applied to the gates LSG, CG and USG, the inversion layers next to the inter-gate dielectric patterns 115a may be formed by the fringe field of the gates LSG, CG and USG. The inversion layers next to the inter-gate dielectric patterns 115a may correspond to a cell source/drain. The thickness of the inter-gate dielectric pattern 115a may be adjusted so that the inversion layer being the cell source/drain may be formed by the fringe field. The inter-gate dielectric patterns 115a may have the same thickness.

A lower selection transistor, memory cells and an upper selection transistor that are formed at one the active pattern 125a configure one cell string. The lower selection transistor, memory cells and upper selection transistor of the cell string are connected in series. The lower selection transistor, memory cells and upper selection transistor of the cell string are stacked on the semiconductor substrate 100. Accordingly, the plane area of the cell string can be minimized at the semiconductor substrate 100.

The lower selection transistor will be described below in detail with reference to FIG. 1C.

Referring to FIGS. 1B and 1C, the lower selection transistor includes a first channel region CH1 and a second channel region CH2. The first channel region CH1 is defined at the semiconductor substrate 100 under the lower selection gate LSG, and the second channel region CH2 is defined at the lower portion of the active pattern 125a next to the lower selection gate LSG. The lower selection gate LSG controls the first and second channel regions CH1 and CH2. The threshold voltage of the first channel region CH1 is different from the second threshold voltage of the second channel region CH2. For this, the dopant concentration of the first channel region CH1 may be different from that of the second channel region CH2. At this point, the dopant concentration of the first channel region CH1 means dopant concentration that affects the first threshold voltage, and the dopant concentration of the second channel region CH2 means dopant concentration that affects the second threshold voltage. The first threshold voltage is the minimum voltage for forming a first channel in the first channel region CH1, and the second threshold voltage is the minimum voltage for forming a second channel in the second channel region CH2. The first channel region CH1 is doped with a first conductive dopant. The first channel region CH1 may include a surface doping layer 105 that is formed at the surface of the semiconductor substrate 100. That is, the dopant concentration of the first channel region CH1 may be adjusted by the surface doping layer 105. The dopant concentration of the surface doping layer 105 may be different from that of the semiconductor substrate 100 (or the dopant concentration of a well region). The dopant concentration of the surface doping layer 105 may be higher than that of the semiconductor substrate 100 (or the dopant concentration of a well region). According to an embodiment of the inventive concept, the dopant concentration of the surface doping layer 105 may be lower than that of the semiconductor substrate 100 (or the dopant concentration of a well region). Unlike this, when the dopant concentration of the semiconductor substrate 100 (or the dopant concentration of a well region) satisfies that of the first channel region CH1, the surface doping layer 105 is omitted, and the dopant concentration of the first channel region CH1 may be adjusted at the dopant concentration of the semiconductor substrate 100 under the lower selection gate LSG.

The second channel region CH2 may be doped with a dopant (i.e., the first conductive dopant) having the same type as that of the first channel region CH1. Unlike this, the second channel region CH2 may be in an intrinsic state. In this case, the dopant concentration of the second channel region CH2 may be '0'. The doping state of the second channel region CH2 may be adjusted by the doping state of the active pattern 125a.

According to an embodiment of the inventive concept, the absolute value of the first threshold voltage of the first channel region CH1 may be greater than that of the second threshold voltage of the second channel region CH2. In this case, the dopant concentration of the first channel region CH1 may be greater than that of the second channel region CH2. At this point, the dopant concentration of the second channel region CH2 may be '0' or may be a real positive number less than the dopant concentration of the first channel region CH1. When the dopant concentration of the second channel region CH2 is a real positive number, the second channel region CH2 is doped with a dopant having the same type as that of the first channel region CH1. The first and second channel regions CH1 and CH2 are electrically connected. The first and second channel regions CH1 and CH2 may be directly connected.

A common source region CS is formed at the semiconductor substrate 100 next to the first channel region CH1. The common source region CS is connected to the one end of the first channel region CH1. That is, the common source region CS is connected to the one end of the first channel region CH1, and the second channel region CH2 is connected to the other end of the first channel region CH1. The common source region CS is doped with a second conductive dopant having a type different from the type of the first channel region CH1 and the type of the semiconductor substrate 100. For example, the first conductive dopant may be a p-type dopant, and the second conductive dopant may be an n-type dopant. To the contrary, the first conductive dopant may be an n-type dopant, and the second conductive dopant may be a p-type dopant. As shown in FIG. 1A, the common source region CS may have a line shape in which it is extended in the first direction (i.e., the y-axis direction). The common source region CS may be disposed under the isolation pattern 160. A plurality of common source regions CS may be extended in parallel in the first direction (i.e., the y-axis direction), inside the semiconductor substrate 100.

As described above, the lower selection gate LSG may have a line shape in which it is extended in the first direction (i.e., the y-axis direction). In this case, the lower selection gate LSG is separated from another lower selection gate LSG adjacent to it. The lower selection gate LSG may be controlled, independently from the other lower selection gate LSG adjacent to it. In other words, the lower selection gate LSG may be independently controlled, and different operation voltages may be applied.

A drain region 165 may be disposed inside the upper portion of the active pattern 125a. The drain region 165 may be doped with the second conductive dopant. The bottom surface of the drain region 165 may be higher than the upper surface of the upper selection gate USG. The capping dielectric pattern 115Ua may be thicker than the inter-gate dielectric pattern 115a. Consequently, the distance between the bottom surface of the drain region 165 and the upper selection gate USG may be obtained.

The first lower selection gate dielectric layer 145a between the lower selection gate LSG and the semiconductor substrate 100 may include the same material as that of the data storage layer 145d. Likewise, the second lower selection gate dielectric layer 145b between the lower selection gate LSG and the active pattern 125a may include the same material as that of the data storage layer 145d. The upper selection gate dielectric layer 145U between the upper selection gate LSG and the active pattern 125a may include the same material as that of the data storage layer 145a. Accordingly, the selection gate dielectric layers 145a, 145b and 145U may be formed of the same material.

A bit line 180 directly connected to the drain region 165 may be disposed at the upper portion of the upper selection gate USG. The bit line 180, as illustrate in FIG. 1A, crosses the upper selection gate USG. That is, the bit line 180 may be extended in the second direction (i.e., the x-axis direction). A plurality of bit lines 180 may be extended in parallel in the second direction (i.e., the x-axis direction). An inter-layer dielectric layer 170 may cover the capping dielectric pattern 115Ua, the active pattern 125a, the drain region 164 and the isolation pattern 160. In this case, the bit line 180 may be disposed on the inter-layer dielectric layer 170, and the bit line 180 may contact the drain region 165 via a bit line plug 175 that passes through the inter-layer dielectric layer 170. The bit line 180 is formed of a conductive material. For example, the bit line 180 may include tungsten, aluminum, or copper. The bit line plug 175 may include tungsten, aluminum, or copper.

According to an embodiment of the inventive concept, the inter-layer dielectric 170 may be filled between the active pattern groups that are separated from each other in the opening 120. In this case, the above-described second charge dielectric pattern (168 in FIG. 3C) may be omitted. According to an embodiment of the inventive concept, the inter-layer dielectric layer 170 and the bit line plug 175 may be omitted. In this case, the bit line 180 may be disposed on the capping dielectric pattern 115Ua to directly contact the drain region 165. When the inter-layer dielectric layer 170 is omitted, the second charge dielectric pattern (168 in FIG. 3C) may fill the opening 120 between the active pattern groups.

The operation method of the above-described semiconductor memory device will be described below. First, the following description will be made on a programming operation of injecting electric charges into the data storage layer 145d of a selected memory cell. A turn-on voltage (for example, a power source voltage) may be applied to a selected upper selection gate USG, and a ground voltage may be applied to a selected bit line 180. Therefore, a cell string including the selected memory cell can be selected. A turn-off voltage (for example, a ground voltage) is applied to unselected upper selection gates. Thus, upper selection transistors including the unselected upper selection gates can be turned off. The same voltage (for example a power source voltage) as a voltage applied to the selected upper selection gate may be applied to the unselected bit lines. Accordingly, the upper selection transistors of unselected cell strings connected to the selected upper selection gate can be turned off.

A ground voltage is applied to the lower selection gate LSG of the selected cell string, and it may be applied to the common source region CS. Therefore, the lower selection transistor of the selected cell string is turned off, and also the lower selection transistors of unselected cell strings that are connected to the selected upper selection gate are turned off.

A programming voltage is applied to the cell gate of the selected memory cell, and a pass voltage Vpass is applied to unselected cell gates. Accordingly, electric charges can be injected into the selected memory cell of the selected cell string. Specifically, the programming voltage is applied to the cell gate of the selected memory cell, and a ground voltage is applied to the channel region of the selected memory cell. Consequently, electric charges can be injected into the data storage layer of the selected memory cell.

The channel regions of unselected memory cells that are connected to the selected cell gate are boosted, and thus the voltage difference between the selected cell gate and the channel regions of the unselected memory cells is reduced. Accordingly, the unselected memory cells connected to the selected cell gate are not programmed. At this point, the lower selection transistors of the unselected cell string connected to the selected cell gate, as described above, include the first and second channel regions CH1 and CH2 that have different threshold voltages. Therefore, the leakage current of the lower selection transistors of the unselected cell strings connected to the selected cell gate can be minimized. As a result, the programming error of the unselected memory cells connected to the selected cell gate can be prevented. Particularly, the absolute value of the first threshold voltage of the first channel region CH1 can be greater than that of the second threshold voltage of the second channel region CH2. Accordingly, although a leakage current is generated through the second channel region CH2 of the active pattern 125a, the leakage current of the lower selection transistors connected to the unselected memory cells can be minimized due to the high threshold voltage of the first channel region CH1.

Subsequently, the reading operation of the semiconductor memory device will be described below. A turn-on voltage (for example, a power source voltage) is applied to the selected upper selection gate, and a pre-voltage is applied to the selected bit line. Therefore, a cell string including the selected memory cell can be selected. A ground voltage can be applied to the unselected bit lines, and a turn-off voltage (for example, a ground voltage) can be applied to the unselected upper selection gates. A reading voltage is applied to the cell gate of the selected memory cell, and a pass voltage is applied to the unselected cell gates of the selected cell string. A turn-on voltage is applied to the lower selection gate of the selected cell string, and a ground voltage may be applied to the common source region CS. Thus, the stored data of the selected memory cell can be read. For example, when the electrons are stored in the selected memory cell, the selected memory cell is turned off, and the pre-voltage of the selected bit line is not transferred to the common source region CS. Unlike this, when electrons are not stored in the selected memory cell, the selected memory cell is turned on by the reading voltage, and the pre-voltage of the bit line may be transferred to the common source region CS.

As described above, the lower selection gates ISG may be independently controlled. In the reading operation, accordingly, a turn-off voltage may be applied to the lower selection gates of the unselected cell strings connected to the selected bit line. Therefore, the lower selection transistors of the unselected cell strings connected to the selected bit line can be turned off. Thus, a leakage current that is generated through the unselected cell strings connected to the selected bit line can decrease. Particularly, because the lower selection transistors includes the first and second channel regions CH1 and CH2 that have different threshold voltages, a leakage current that is generated through the unselected cell strings connected to the selected bit line can be minimized. As a result, the reading error of the semiconductor memory device can be prevented.

Subsequently, the erasing operation of the semiconductor memory cell will be described below. Electric charges, which are stored in the data storage layer 145d of the memory cell, are discharged to the active pattern 125a, and an erasing operation can be performed. Unlike this, by injecting electric charges stored in the data storage layer 145d and opposite type of electric charges into the data storage layer 145d, an erasing operation can be performed. Any one of the memory cells is selected and erased, or the memory cells may be simultaneously erased in block units.

The following description will be made on a method for fabricating a semiconductor memory device according to an embodiment of the inventive concept.

FIGS. 2A through 2H are cross-sectional views taken along line ⌐-⌐' in FIG. 1A for describing a method for fabricating a semiconductor memory device according to an embodiment of the inventive concept.

Figure 2A:
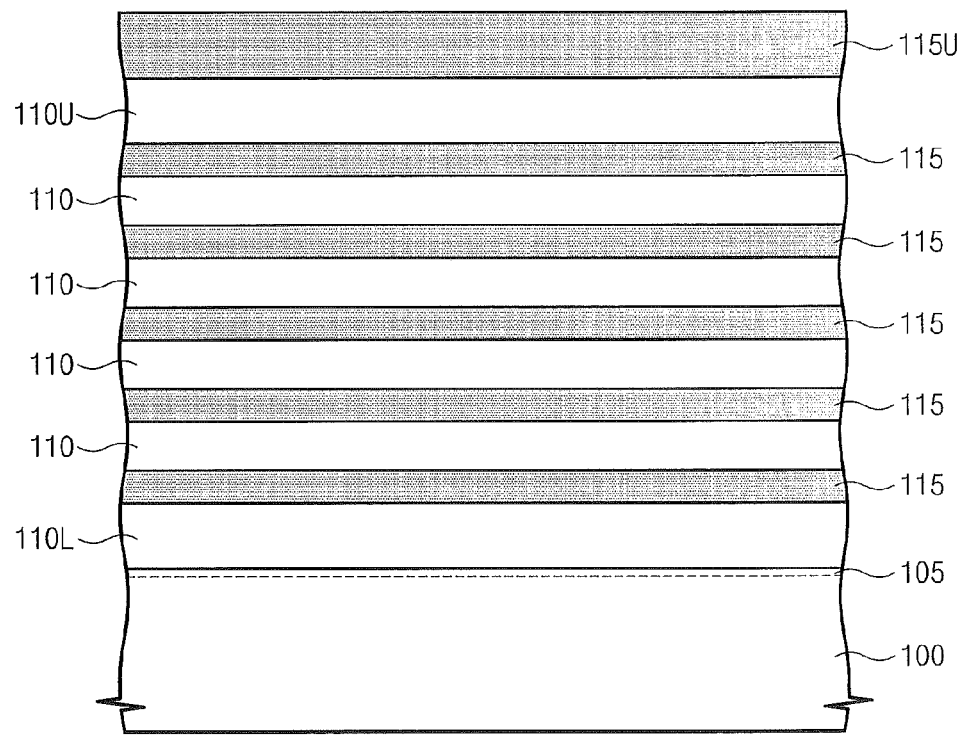
FIGS. 2A through 2H are cross-sectional views taken along line I-I' in FIG. 1A for describing a method for fabricating a semiconductor memory device according to an embodiment of the inventive concept.

Referring to FIG. 2A, a semiconductor substrate 100 that is doped with a first conductive dopant is prepared. By forming a well region that is doped with the first conductive dopant at the semiconductor substrate 100, the semiconductor substrate 100 may be doped with the first conductive dopant. By injecting dopants for threshold voltage control into the surface of the semiconductor substrate 100, a surface doping layer 105 may be formed. The surface doping layer 105 is doped with the first conductive dopant. The dopant concentration of the surface doping layer 105 may be different from the dopant concentration of the semiconductor substrate 100 (or the dopant concentration of the well region). The dopant concentration of the surface doping layer 105 may be higher than that of the semiconductor substrate 100. In this case, the dopants for threshold voltage control may be the first conductive dopant. Unlike this, the dopant concentration of the surface doping layer 105 may be lower than the dopant concentration of the semiconductor substrate 100. Herein, the dopants for threshold voltage control may be a second conductive dopant. At this point, the concentration of the injected second conductive dopant is lower than the concentration of the first conductive dopant of the surface of the semiconductor substrate 100. The carriers of the second conductive dopants that are injected into the surface doping layer 105 are combined with the carriers of the first conductive dopants of the surface doping layer 105 and are thereby erased. Accordingly, the concentration of the first conductive dopant that affects a threshold voltage in the surface doping layer 105 may be lower than the dopant concentration of the semiconductor substrate 100. According to an embodiment of the inventive concept, forming the surface doping layer 105 may be omitted.

Sacrificial layers 110L, 110 and 110U and dielectric layers 115 and 115U are alternately stacked on the semiconductor substrate 100. The dielectric layers 115 and 115U may include at least one of an oxide layer, a nitride layer, a carbide layer and an oxynitride layer. The sacrificial layers 110L, 110 and 110U are formed of materials that have an etch selectivity with respect to the dielectric layers 115 and 115U. For example, when the dielectric layers 115 and 115U are formed as oxide layers, the sacrificial layers 110L, 110 and 110U may include at least one of a nitride layer and an oxynitride layer. Unlike this, when the dielectric layers 115 and 115U are formed as a nitride layer and an oxynitride layer, the sacrificial layers 110L, 110 and 110U may be formed as oxide layers.

A lowermost sacrificial layer 110L and an uppermost sacrificial layer 110U of the sacrificial layers 110L, 110 and 110U may be thicker than the sacrificial layer 110 between these. The thicknesses of the lowermost and uppermost sacrificial layers 110L and 110U may define the thicknesses of the lower and upper selection gates LSG and USG, respectively. An uppermost dielectric layer 115U of the dielectric layers 115 and 115U may be thicker than the dielectric layers 115 under it.

Figure 2B:
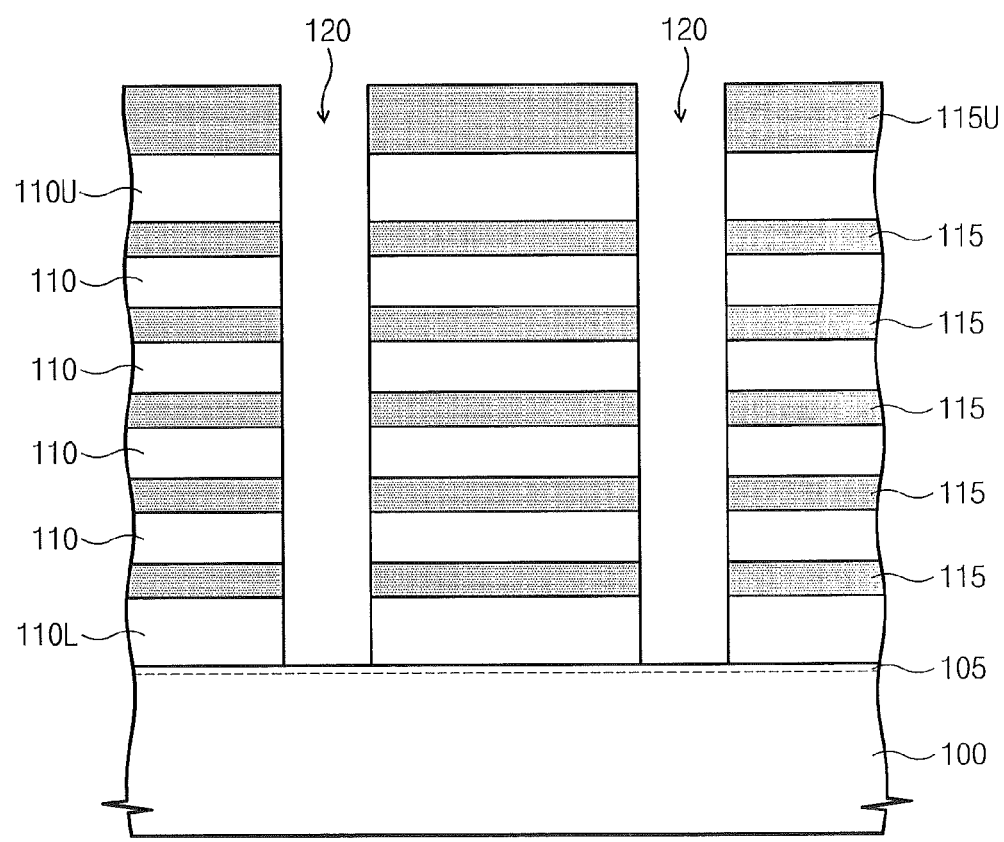

Referring to FIG. 2B, by continuously patterning the dielectric layers 115 and 115U and the sacrificial layers 110L, 110 and 110U, openings 120 may be formed. The openings 120, as illustrated in FIG. 1A, may have groove shapes in which they are extended along one direction parallel to a top surface of the semiconductor substrate 100 in parallel. The openings 120 are separated from each other. The opening 120 may expose the semiconductor substrate 100.

Figure 2C:
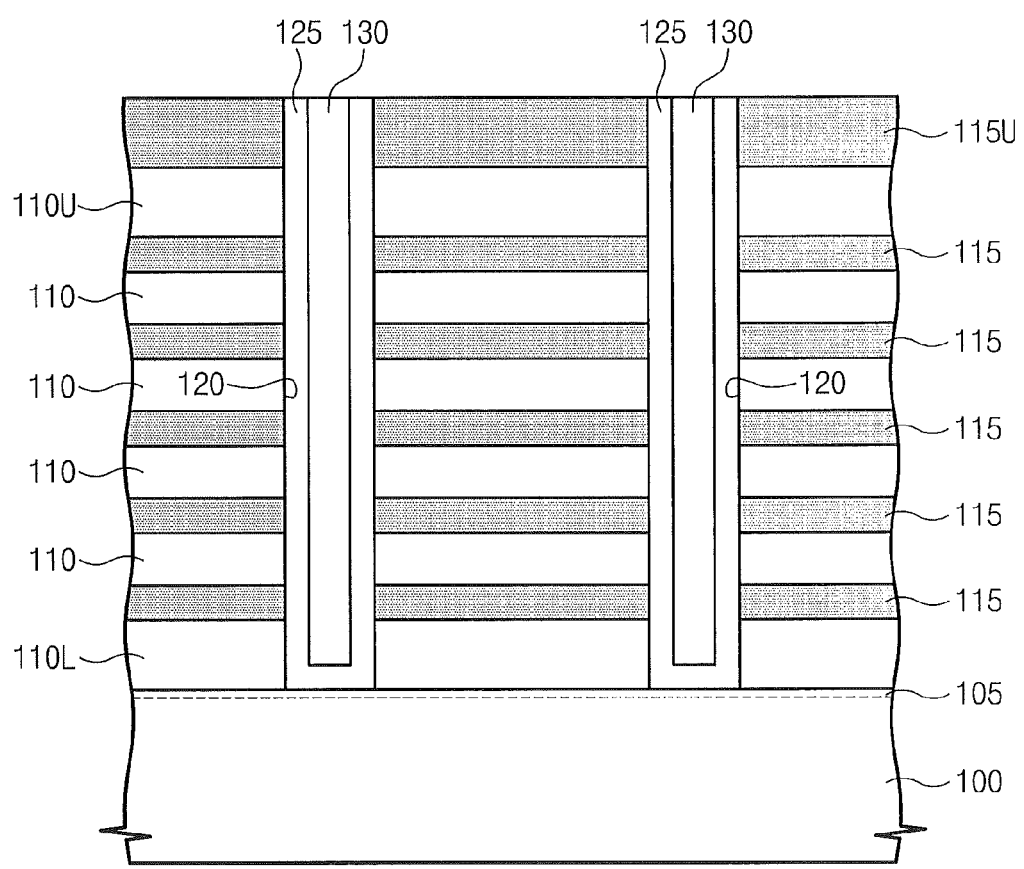
Figure 2D:
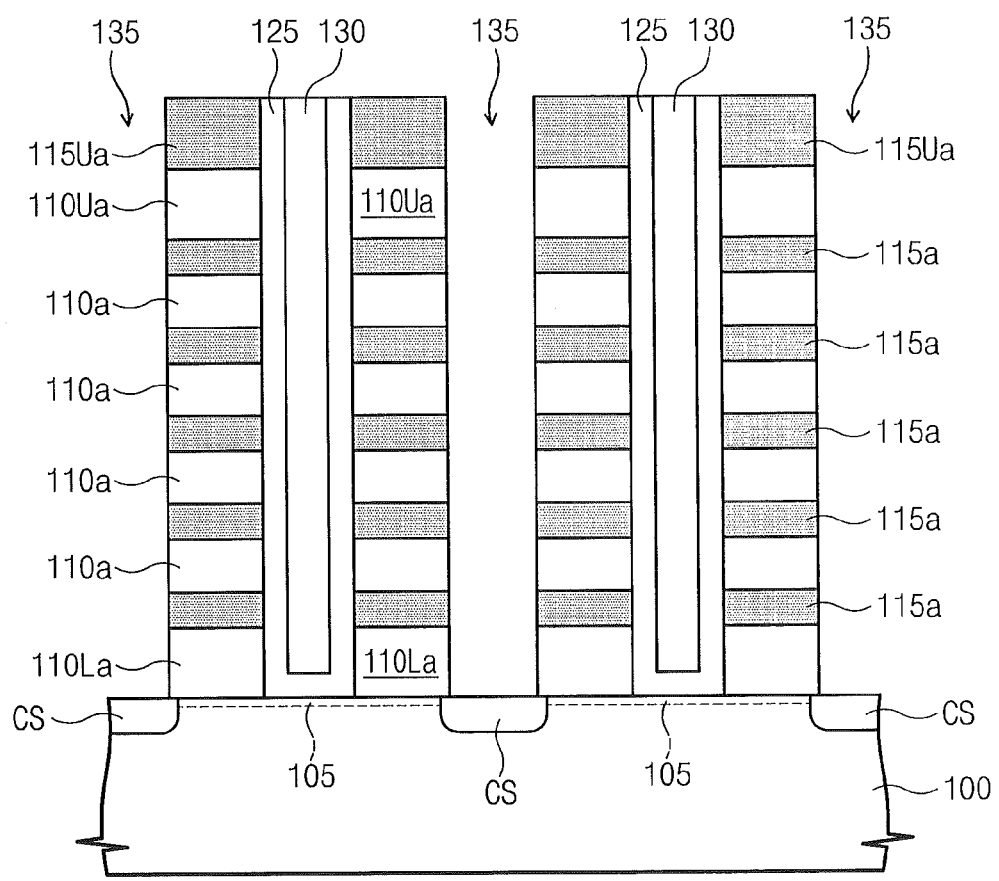

Referring to FIG. 2C, an active layer 125 covering the inner sidewalls and bottom surface of the opening 120 is formed. A first charge dielectric layer 130 may be disposed in the opening 120 and fill a space that is surrounded by the active layer 125. The active layer 125 may be formed of periodic table group 4A element (or group 14 element). For example, the active layer 125 may be formed as at least one of a silicon layer, silicon-germanium layer and a germanium layer. The active layer 125 may be formed in a chemical vapor deposition process or an atomic layer deposition process. Specifically, the active layer 125 may be formed over the semiconductor substrate 100 having the opening 120 in a chemical vapor deposition process or an atomic layer deposition process. A first charge dielectric layer 130 filling the opening 120 may be formed on the active layer 125. Subsequently, the first charge dielectric layer 130 and the active layer 125 may be planarized until the uppermost dielectric layer 115U is exposed. Accordingly, the active layer 125 and the first charge dielectric layer 130 may be restrictively formed inside the opening 120. The active layer 125 and first charge dielectric layer 130 of the opening 120 is extended in parallel to the opening 120. According to an embodiment of the inventive concept, the opening 120 may be filled with the active layer 125. In this case, the first charge dielectric layer 130 may be omitted.

Referring to FIG. 2D, by again patterning the patterned dielectric layers 115U and 115 and the sacrificial layers 110L, 110 and 110U, a trench 135 is formed. The trench 135, as illustrated in FIG. 1A, may be extended in parallel to the opening 120. The trench 135 may be formed between a pair of openings 120 that are adjacent to each other. The trench 135 is separated from the opening 120. By forming the trench 120, sacrificial patterns 110La, 110a and 110Ua and dielectric patterns 115a and 115Ua (which are alternately stacked) may be formed on the semiconductor substrate 100.

The patterns 110La, 110a, 110Ua, 115a and 115Ua are extended in parallel to the opening 120 and the trench 135. An uppermost dielectric pattern 115Ua of the dielectric patterns 115a and 115Ua corresponds to the capping dielectric pattern 115Ua in FIG. 1B, and the dielectric patterns 115a under the capping dielectric pattern 115Ua correspond to the inter-gate dielectric patterns 115a in FIG. 1B.

Subsequently, by injecting second conductive dopant ions into the semiconductor substrate 100 through the trench 130, a common source region CS is formed. The common source region CS is self-aligned with the trench 130. Accordingly, the common source region CS may be formed in a line shape where it is extended in parallel to the trench 130.

Figure 2E:
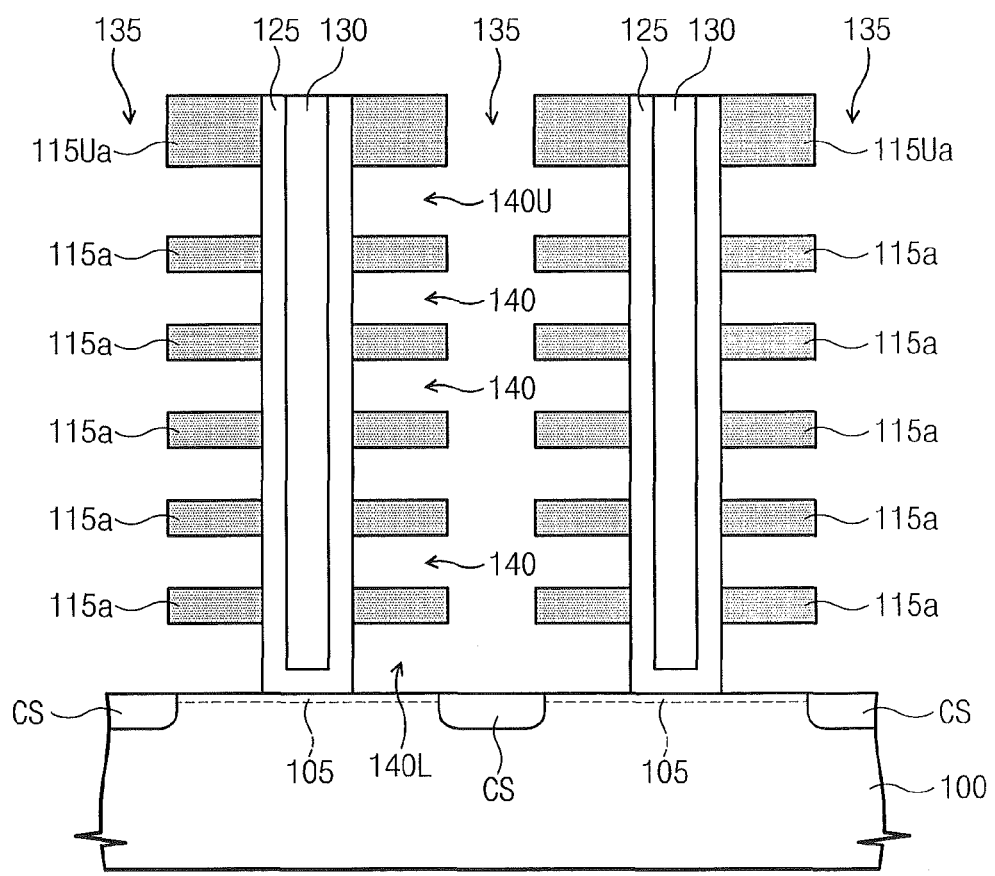

Referring to FIG. 2E, the sacrificial patterns 110La, 110a and 110Ua that are exposed to the inner sidewalls of the trench 135 are removed. Accordingly, empty regions 140L, 140 and 140U for exposing the respective portions of the sidewalls of the active layer 125 are formed. At this point, the inter-gate dielectric patterns 115a and the capping dielectric pattern 115Ua contact the sidewall of the active layer 125 and are thereby supported.

A lowermost empty region 140L of the empty regions 140L, 140 and 140U is formed by removing a lowermost sacrificial pattern 110La of the sacrificial patterns 110La, 110a and 110Ua, and an uppermost empty region 140U of the empty regions 140L, 140 and 140U is formed by removing an uppermost sacrificial pattern 110Ua of the sacrificial patterns 110La, 110a and 110Ua. Empty regions 140 between the lowermost and uppermost empty regions 140L and 140U are formed by removing sacrificial patterns 110a between the lowermost and uppermost sacrificial patterns 110La and 110Ua. In a subsequent process, a lower selection gate LSG is formed inside the lowermost empty region 140L, an upper selection gate USG is formed inside the uppermost empty region 140U, and cell gates CG are formed inside the empty regions 140 between the lowermost and uppermost empty regions 140L and 140U, respectively.

Figure 2F:
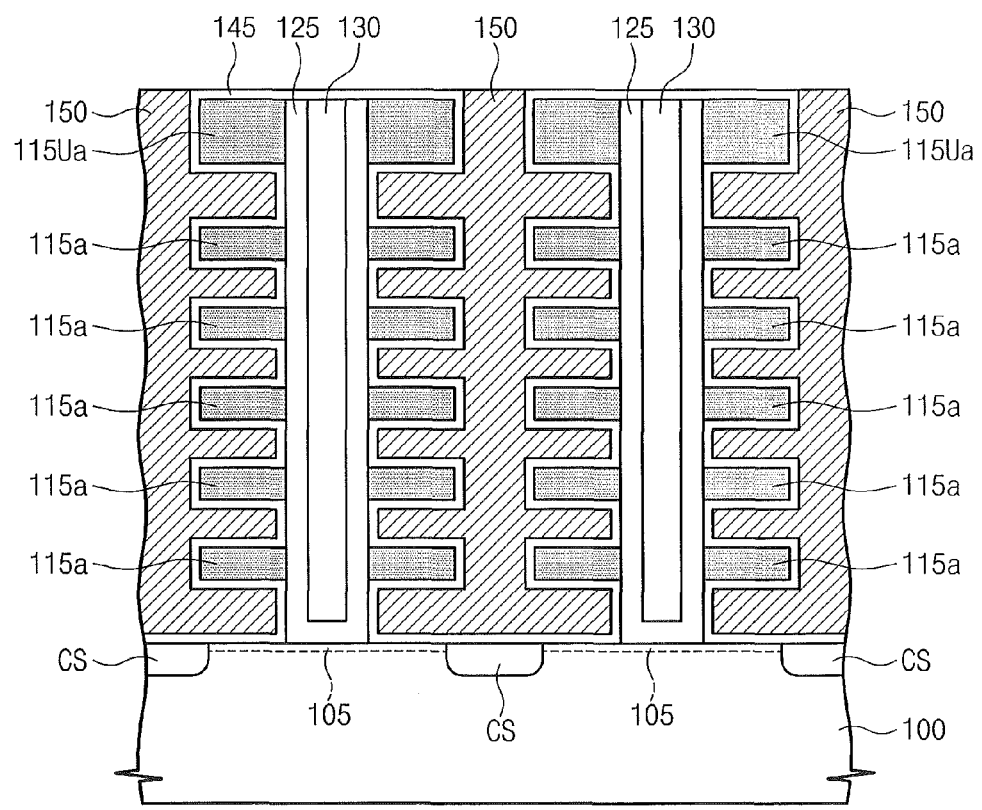

Referring to FIG. 2F, a gate dielectric layer 145 is formed on the semiconductor substrate 100 having the empty regions 140L, 140 and 140U. The gate dielectric layer 145 is conformally formed at the inner surfaces of the empty regions 140L, 140 and 140U and the inner surface of the trench 135. The gate dielectric layer 145 may include a tunnel dielectric layer, a charge trapping layer and a blocking dielectric layer. The tunnel dielectric layer may be formed in a thermal oxidization process and thereby be restrictively formed at the sidewall of the active layer 125 that is exposed to the empty regions 140L, 140 and 140U. The charge trapping layer and the blocking dielectric layer may be formed in a chemical vapor deposition process or an atomic layer deposition process.

A conductive layer 150 filling the empty regions 140L, 140 and 140U are formed on the semiconductor substrate 100 having the gate dielectric layer 145. The conductive layer 150 is planarized until the gate dielectric layer 145 on the capping dielectric patterns 115Ua is exposed.

Figure 2G:
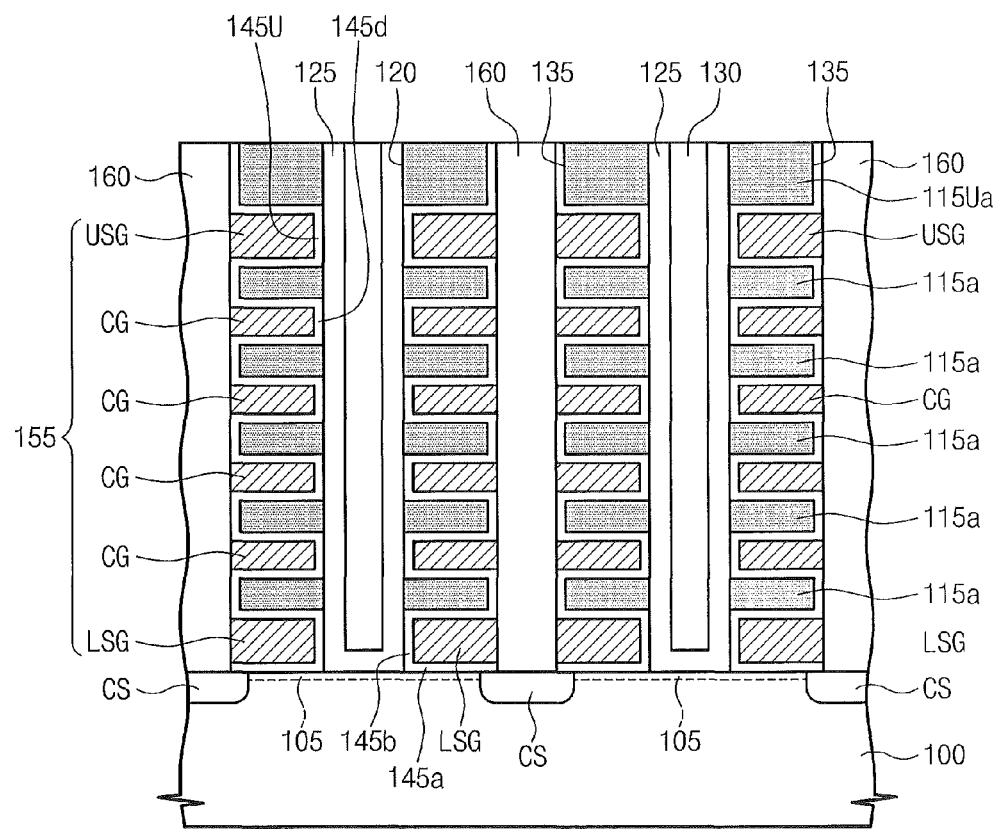

Referring to FIG. 2G, after the planarization of the conductive layer 150, the conductive layer 150 is anisotropic etched by using the capping dielectric pattern 115Ua and/or the gate dielectric layer 145 on it as an etching mask. The conductive layer 150 is anisotropic etched until the gate dielectric layer 145 on the bottom surface of the trench 135 is exposed. Accordingly, the conductive layer 150 in the trench 135 is removed. At this point, the portions of the conductive layer 150 in the empty regions 140L, 140 and 140U are left, thereby forming the lower selection gate LSG, the cell gates CG and the upper selection gates USG. By removing the conductive layer 150 in the trench 135, the gates LSG, CG and USG are separated from each other. Subsequently, an isolation pattern 160 filling the trench 135 is formed. The isolation pattern 160 may be formed of an oxide, a nitride and/or an oxynitride.

The active layer 125 and first charge dielectric layer 130 of the opening 120 is exposed. By removing the gate dielectric layer 145 on the capping dielectric pattern 115Ua, the active layer 125 and first charge dielectric layer 130 of the opening 120 may be exposed.

Figure 2H:
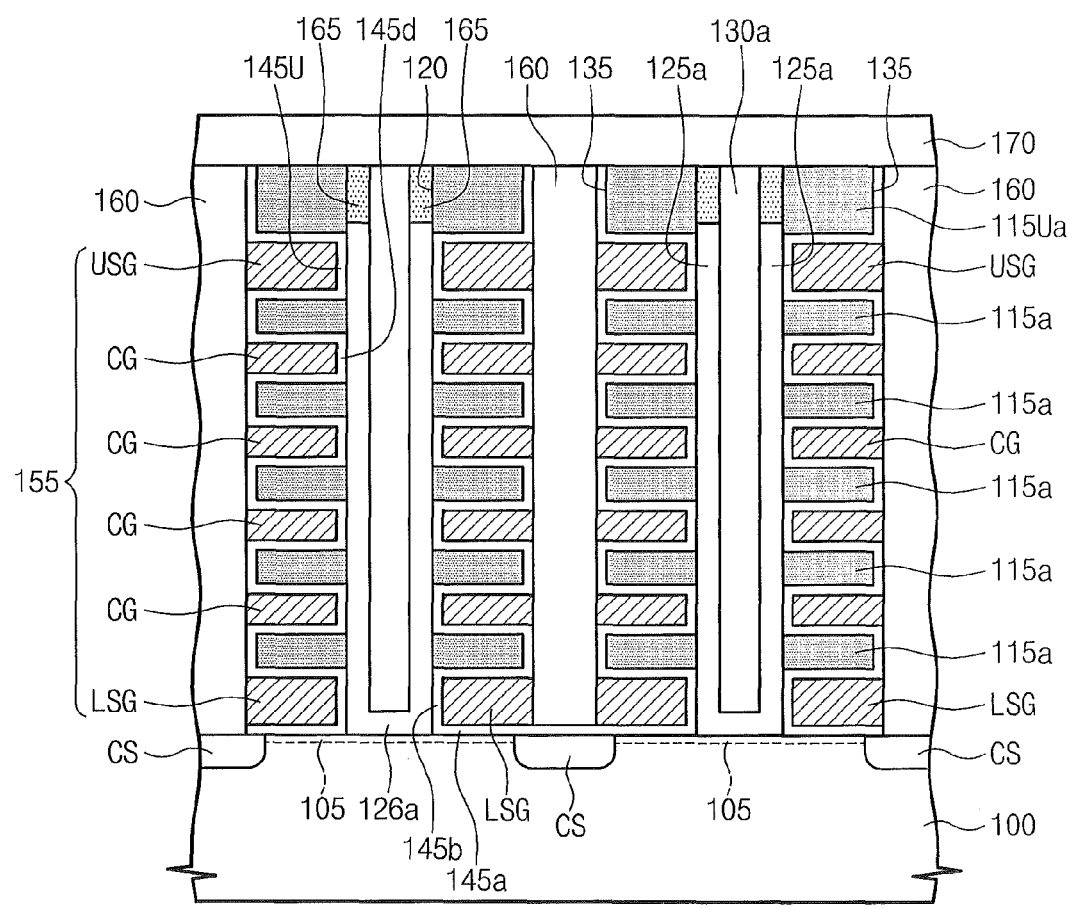

Referring to FIG. 2H, active patterns 125a and first charge dielectric patterns 130a are formed in the opening 120. A method for forming the active patterns 125a and the first charge dielectric patterns 130a will be described below in detail with reference to FIGS. 3A through 3C.

Figure 3A:
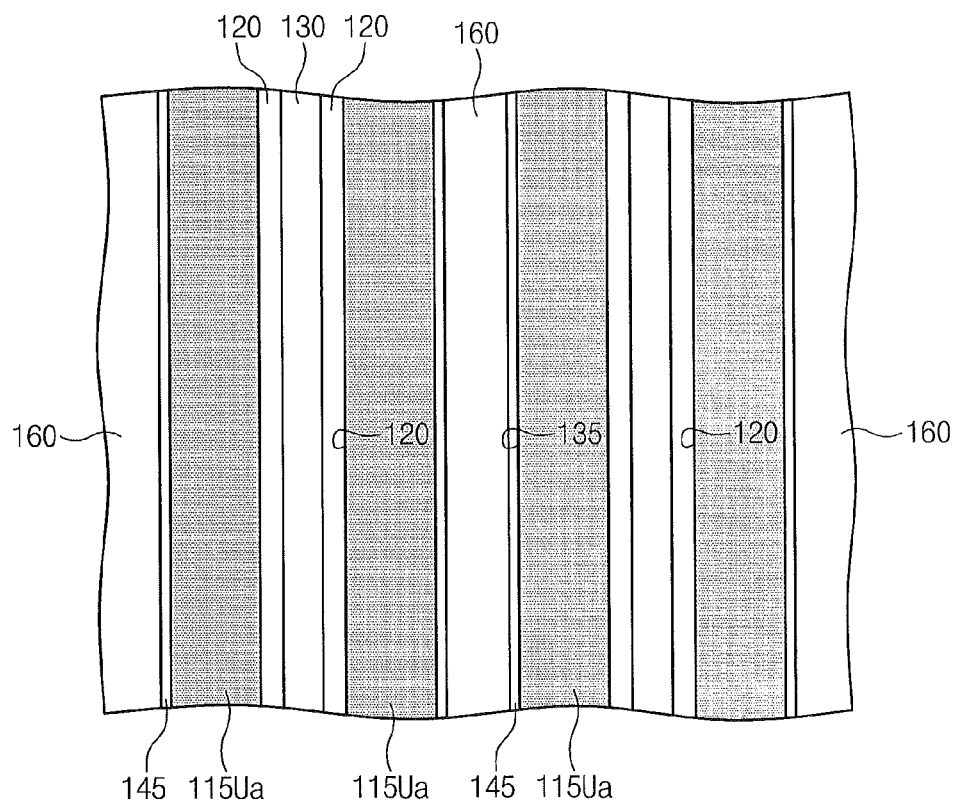
FIGS. 3A through 3C are plan views for describing a method of forming the active patterns of a semiconductor memory device according to an embodiment of the inventive concept.
Figure 3B:
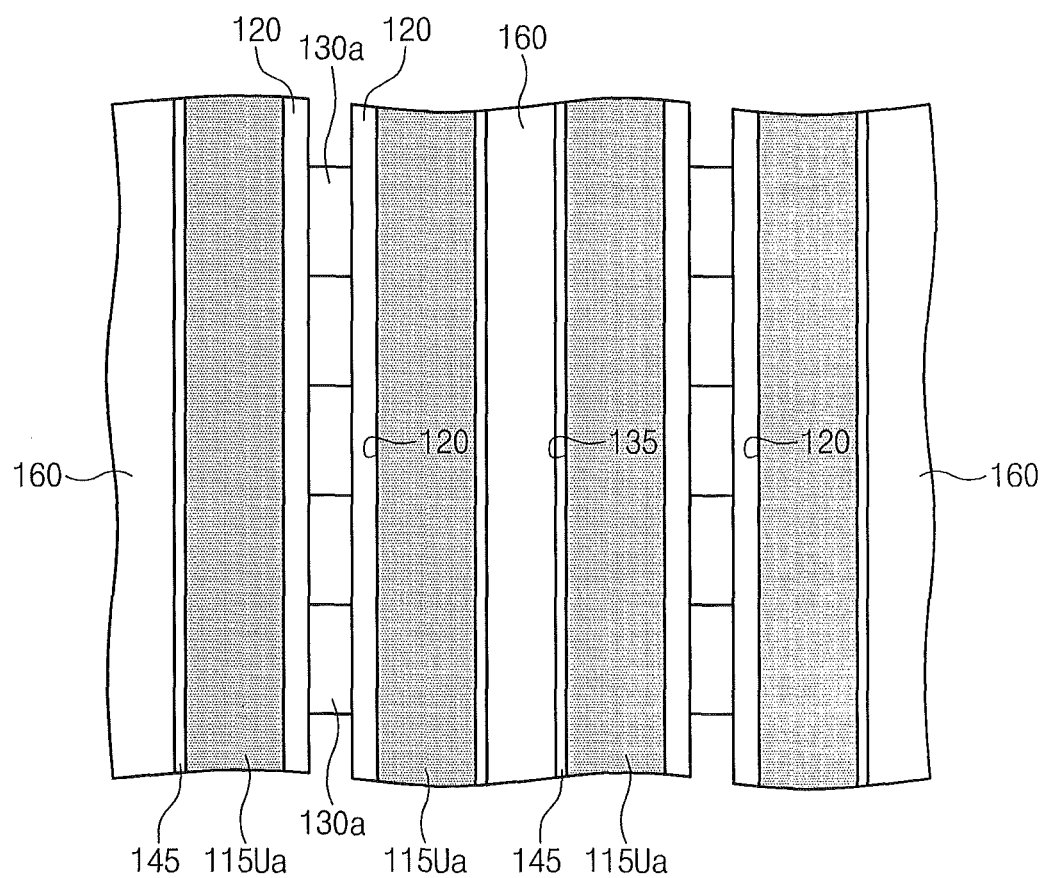
Figure 3C:
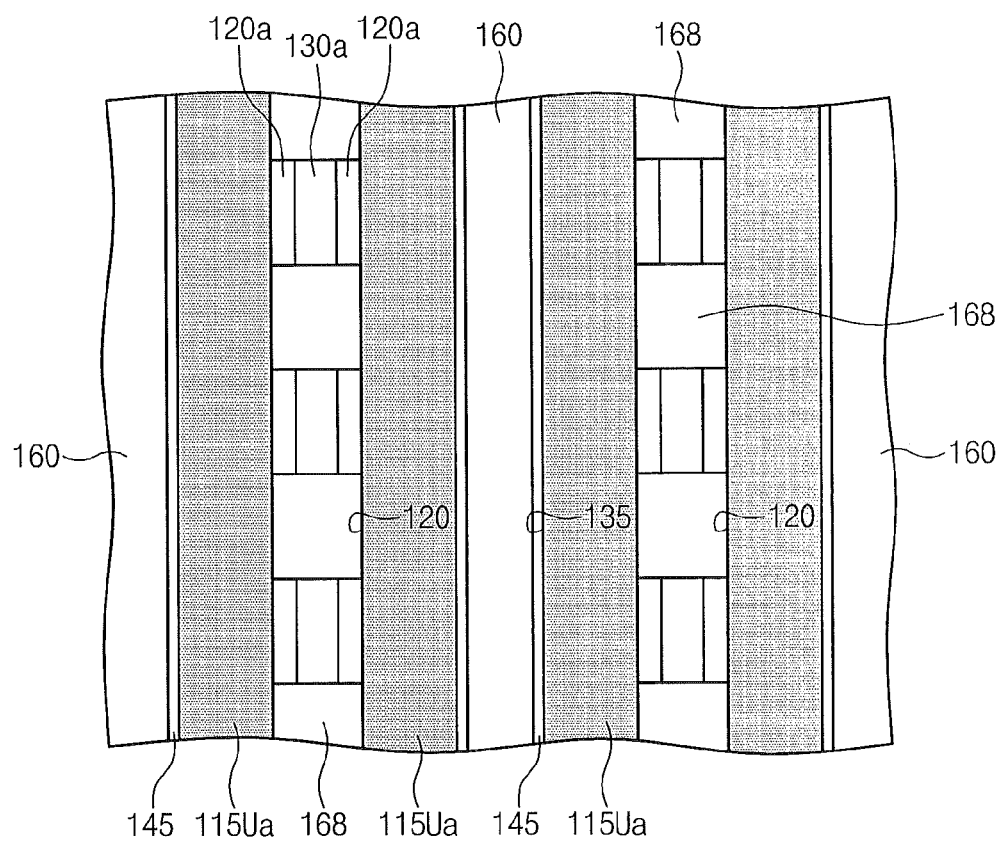

FIGS. 3A through 3C are plan views for describing a method of forming the active patterns of a semiconductor memory device according to an embodiment of the inventive concept.

Referring to FIGS. 3A through 3B, the active layer 125 and first charge dielectric layer 130 of the opening 120 have shapes in which they are extended in one direction.

As shown in FIG. 3B, by patterning the first charge dielectric layer 130, a first charge dielectric patterns 130a may be formed in the opening 120. The first charge dielectric patterns 130a disposed in any one of the openings 120 are separated from each other in the one direction.

Referring to FIGS. 2H and 3C, the active layer 125 is isotropic etched by using the first charge dielectric patterns 130a as a mask, thereby forming the active patterns 125a. The active pattern 125a may be formed between the sidewall of the opening 120 and the first charge dielectric pattern 130a. At this point, an active layer that is left between the first charge dielectric pattern 130a and the semiconductor substrate 100 may be formed as an active bottom portion 126a.

Subsequently, a second charge dielectric pattern 168 filling the opening 120 between the first charge dielectric patterns 130a may be formed. The second charge dielectric pattern 168 may be formed by forming a second charge dielectric layer that fills the opening 120 between the first charge dielectric patterns 130a and planarizing the second charge dielectric layer until the capping dielectric pattern 115Ua is exposed. The second charge dielectric pattern 168 may be formed of an oxide, a nitride and/or an oxynitride.

In another method, the active pattern 125a and the first charge dielectric pattern 130a may be formed in a patterning process. Specifically, a mask pattern (not shown) that crosses the first charge dielectric layer 130 and the active layer 125 in FIG. 3A is formed, and the first charge dielectric layer 130 and the active layer 125 are anisotropic etched by using the mask pattern as an etching mask, thereby forming the active pattern 125a and the first charge dielectric pattern 130a.

A portion of a gate dielectric layer between the active pattern 125a and the cell gate CG is included in the data storage layer 145d, and a portion of a gate dielectric layer between the active pattern 125a and the upper selection gate USG is included in the upper selection gate dielectric layer 145U. A portion of a gate dielectric layer between the semiconductor substrate 100 and the lower selection gate LSG is included in the first lower selection gate dielectric layer 145a, and a portion of a gate dielectric layer between the active pattern 125a and the lower selection gate LSG is included in the second lower selection gate dielectric layer 145b.

By injecting a second conductive dopant into the upper portion of the active pattern 120a, a drain region 165 may be formed. The drain region 165 may be formed after forming the second charge dielectric pattern 168. Unlike this, the drain region 165 may be formed at the upper portion of the active layer 125 of the opening 120 before forming the first charge dielectric pattern 135a.

As disclosed in FIG. 2H, an inter-layer dielectric layer 170 covering the active pattern 125a and the drain region 165 may be formed. In a case where the drain region 165 is formed after forming the second charge dielectric pattern 168, the inter-layer dielectric layer 170 may cover the second charge dielectric pattern 168. Unlike this, in a case where the drain region 165 is formed before forming the first charge dielectric pattern 130a, the second charge dielectric pattern 168 is omitted, and the inter-layer dielectric layer 170 may fill the opening 120 between the first charge dielectric patterns 130a.

Subsequently, the bit line plug 175 (see FIG. 1B) that is connected to the drain region 165 through the first inter-layer dielectric layer 170 may be formed. The bit line 180 in FIGS. 1A and 1B may be formed on the first inter-layer dielectric layer 170. Accordingly, the semiconductor memory device that is disclosed FIGS. 1A through 1C can be fabricated.

Second Embodiment

Other types of gates according to another embodiment of the inventive concept will be disclosed below. A semiconductor memory device according to another embodiment of the inventive concept may have a three-dimensional structure.

Figure 4A:
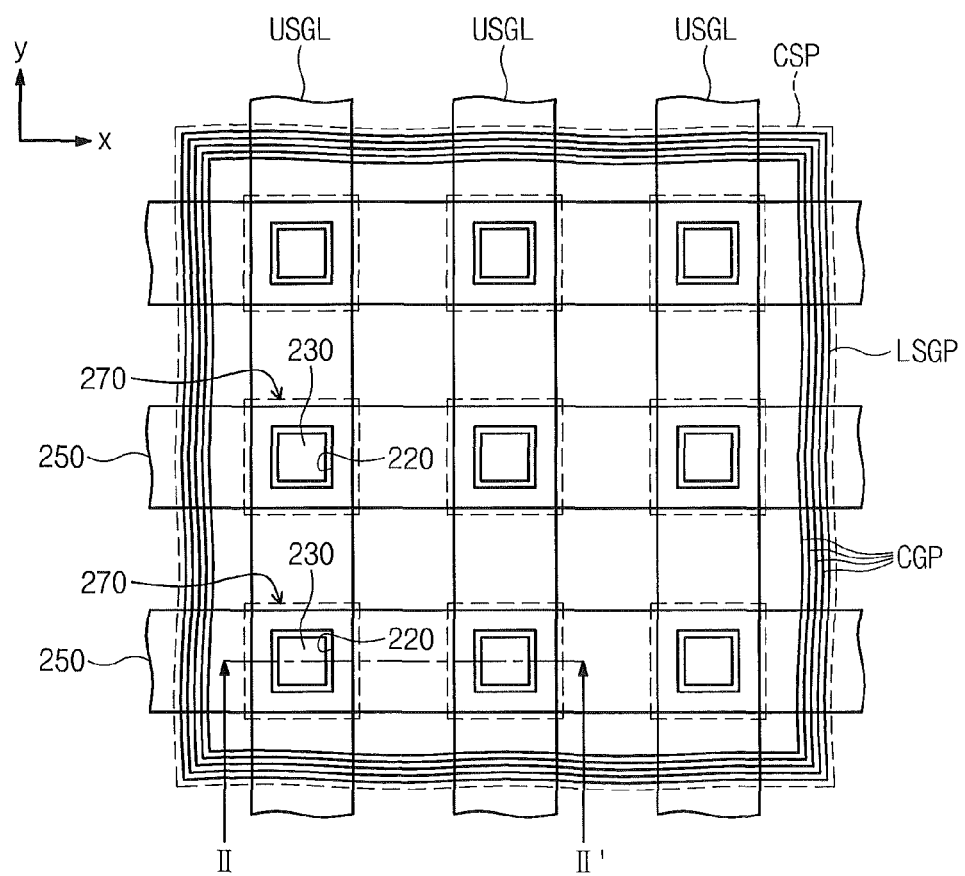
FIG. 4A is a plan view illustrating a semiconductor memory device according to another embodiment of the inventive concept.
Figure 4B:
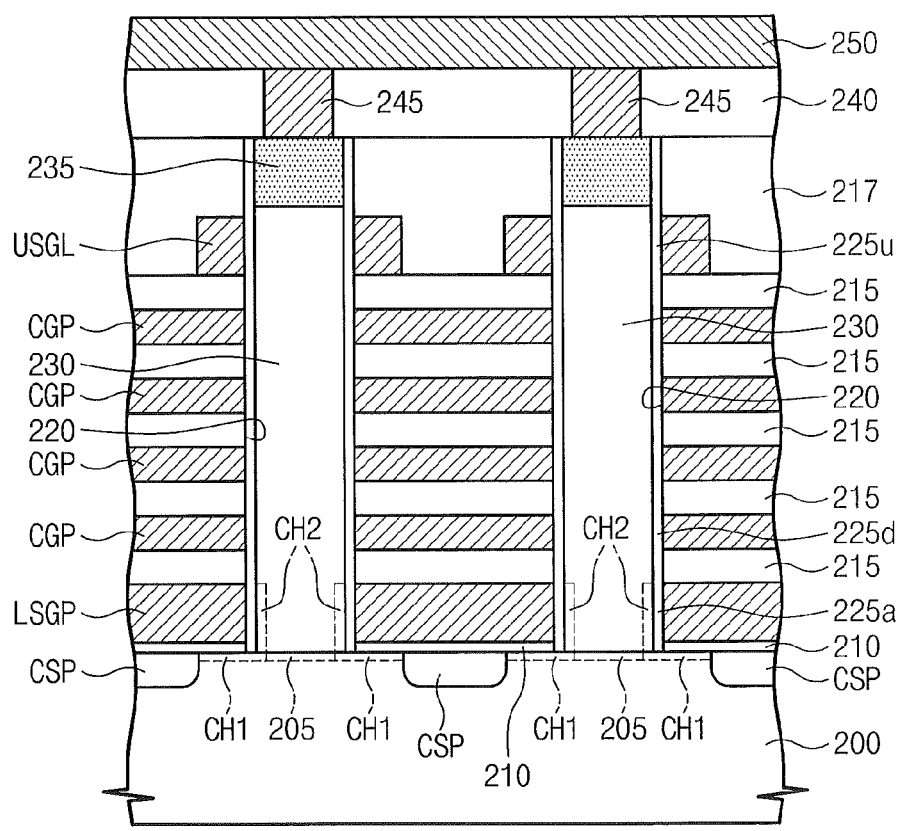
FIG. 4B is a cross-sectional view taken along line II-II' in FIG. 4A.

FIG. 4A is a plan view illustrating a semiconductor memory device according to another embodiment of the inventive concept. FIG. 4B is a cross-sectional view taken along line II-II' in FIG. 4A.

Referring to FIGS. 4A and 4B, a lower selection gate LSGP is disposed on a semiconductor substrate 200. The semiconductor substrate 200 may be formed of periodic table group 4A element (or group 14 element). For example, the semiconductor substrate 200 may be a silicon substrate, a germanium substrate or a silicon-germanium substrate. The semiconductor substrate 200 is doped with a first conductive dopant. A well region, doped with the first conductive dopant, is formed in the semiconductor substrate 200 and thereby the semiconductor substrate 200 may be doped with the first conductive dopant. For example, the semiconductor substrate 200 in FIG. 4B may have the well region. The lower selection gate LSGP may have a flat shape. A first lower selection gate dielectric layer 210 is disposed between the lower selection gate LSGP and the semiconductor substrate 200. The first lower selection gate dielectric layer 210 may include at least one of an oxide, a nitride, an oxynitride and a metal oxide.

Cell gates CGP and inter-gate dielectric patterns 215 are alternately stacked on the lower selection gate LSGP. A lowermost inter-gate dielectric pattern of the inter-gate dielectric patterns 215 is disposed between the lower selection gate LSGP and a lowermost cell gate of the cell gates CGP. The cell gates CGP may have flat shapes. Accordingly, the inter-gate dielectric patterns 215 may also have flat shapes. An upper selection gate USGL is disposed on an uppermost inter-gate dielectric pattern of the inter-gate dielectric patterns 215. The upper selection gate USGL, as illustrated in FIG. 4A, may have a line shape in which it is extended in a first direction. A plurality of upper selection gates USGL may be extended in the first direction in parallel, on the uppermost inter-gate dielectric pattern 215. The first direction is parallel to the upper surface of the semiconductor substrate 100. The first direction may correspond to the y-axis direction in FIG. 4A. The gates LSGP, CGP and USGP may include at least one of doped periodic table group 4A element (for example, doped silicon, doped germanium and doped silicon-germanium, etc), metals (for example, tungsten, titanium, tantalum and aluminum, etc), conductive metal nitrides (for example, nitride titanium and nitride tantalum, etc) and metal-group 4A element compounds (for example, tungsten silicide, cobalt silicide and titanium silicide, etc). The selection gates LSGP and USGL may include the same conductive material as that of the cell gates CGP. Unlike this, the selection gates LSGP and USGL and the cell gates CGP may include different conductive materials, respectively. The inter-gate dielectric patterns 215 may include at least one of an oxide, a nitride, a carbide and an oxynitride. The first inter-layer dielectric layer 217 is formed on the gates LSGP, CGP and USGL. The first inter-layer dielectric layer 217 may include an oxide, a nitride, a carbide and an oxynitride.

The active pattern 230 is disposed in an opening 220 that continuously passes through the first inter-layer dielectric layer 217, the upper selection gate USGL, the cell gates CGP, the inter-gate dielectric patterns 215, the lower selection gate LSGP and the first lower selection gate dielectric layer 210. The active pattern 230 is disposed on the semiconductor substrate 200 inside the opening 220 to be extended toward a direction far away from the semiconductor substrate 200. The opening 220 may have a hole shape. In plane view, as shown in FIG. 4A, the opening 220 may have a tetragonal shape, but it is not limited thereto. In plane view, the opening 220 may have various shapes such as circle, oval and polygon. A plurality of openings 220 are separated in parallel to pass through the gates USGL, CGP and LSGP, and a plurality of active patterns 230 are disposed in the openings 220, respectively. The active patterns 230 may be two-dimensionally arranged on the semiconductor substrate 200. Any one of the active patterns 230 is included in one cell string.

The active pattern 230, as shown, may have a pillar shape. According to an embodiment of the inventive concept, the active pattern 230 may have a hollow casket shape. The inside of the active pattern 230 having the casket shape may be filled with an insulator. In this embodiment, as shown, the active pattern 230 having a pillar shape will be described below. The active pattern 230 may be formed of periodic table group 4A element (or group 14 element). For example, the active pattern 230 may be formed of silicon, germanium and/or silicon-germanium. The active pattern 230 may be formed of periodic table group 4A element (or group 14 element), identically to the semiconductor substrate 200. As an example, the semiconductor substrate 200 is a silicon substrate, and the active pattern 230 may be formed of silicon. The active pattern 230 may be doped with a dopant (i.e., the first conductive dopant) having the same type as the dopant type of the semiconductor substrate 200. Unlike this, the active pattern 230 may be in a state, i.e., an intrinsic state, where it is not doped with a dopant.

The inner sidewall of the opening 220 may include the one sidewalls of the gates LSGP, CGP and USGL, the one sidewalls of the inter-gate dielectric patterns 215, and the one sidewall of the first inter-layer dielectric layer 217. The inner sidewall of the opening 220 is adjacent to the sidewall of the active pattern 230. A data storage layer 225u is disposed between the active pattern 230 and the each cell gate CG. The data storage layer 225d may be formed of the same material as that of the data storage layer 145d in FIG. 1B. An upper selection gate dielectric layer 225u is disposed between the active pattern 230 and the upper selection gate USGL. The upper selection gate dielectric layer 225u may include the same material as that of the data storage layer 225d. A second lower selection gate dielectric layer 225a is disposed between the lower selection gate dielectric layer 225a and the lower portion of the active pattern 230. The second lower selection gate dielectric layer 225a may include the same material as that of the data storage layer 225d.

The upper selection gate USGL may control the channel region of an upper selection transistor that is defined at the active pattern 230 next to the upper selection gate dielectric layer 225u. The cell gate CG may control a cell channel region that is defined at the active pattern 230 next to the data storage layer 225d. A first channel region CH1 is defined at the semiconductor substrate 200 under the lower selection gate LSGP, and a second channel region CH2 is defined at the lower portion of the active pattern 230 next to the lower selection gate LSGP. The lower selection gate LSGP controls the first and second channel regions CH1 and CH2. That is, a lower selection transistor including the lower selection gate LSGP includes the first and second channel regions CH1 and CH2. The first and second channel regions CH1 and CH2 may be directly connected. The first threshold voltage of the first channel region CH1 is different from the second threshold voltage of the second channel region CH2. Accordingly, a leakage current that is generated through the lower selection transistor can be minimized. The dopant concentration of the first channel region CH1 may be different from that of the second channel region CH2. At this point, the dopant concentration of the second channel region CH2 may be '0' or a positive real number. The dopant concentration of the first channel region CH1 may be different from that of the semiconductor substrate 200. Unlike this, the first channel region CH1 may include a surface doping layer 205 that is formed at the surface of the semiconductor substrate 200. Therefore, the dopant concentration of the first channel region CH1 may be adjusted by the surface doping layer 205. The surface doping layer 205 is doped with a first conductive dopant. The dopant concentration of the surface doping layer 205 may be higher or lower than that of the semiconductor substrate 200.

According to an embodiment of the inventive concept, the absolute value of the first threshold voltage of the first channel region CH1 may be greater than that of the second threshold voltage of the second channel region CH2. In this case, the dopant concentration of the first channel region CH1 may be higher than that of the second channel region CH2. The dopant concentration of the first channel region CH1 denotes a dopant concentration that affects the first threshold voltage, and the dopant concentration of the second channel region CH2 denotes a dopant concentration that affects the second threshold voltage.

According to an embodiment of the inventive concept, the first lower selection gate dielectric layer 210 and the second lower selection gate dielectric layer 225a may be formed of the same material. According to an embodiment of the inventive concept, the first lower selection gate dielectric layer 210 and the second lower selection gate dielectric layer 225a may be formed of different materials. According to an embodiment of the inventive concept, the Equivalent Oxide Thickness (EDT) of the first lower selection gate dielectric layer 210 may be thicker than that of the second lower selection gate dielectric layer 225a.

A common source region CSP that is doped with a second conductive dopant is disposed at the semiconductor substrate 200 of the one side of the first channel region CH1. The common source region CSP may be connected to the one end of the first channel region CH1, and the second channel region CH2 may be connected to the other end of the first channel region CH1. The common source region CSP may be formed at the semiconductor substrate 200 under the lower selection gate LSGP other than the inside of a dotted line 270 in FIG. 4A. The inner region of the dotted line 270 includes the bottom surface of the opening 220. Moreover, the inner region of the dotted line 270 includes the semiconductor substrate 200 peripheral to the bottom surface of the opening 220. The surface of the semiconductor substrate 200 between the dotted line 270 and the bottom surface of the opening 220 may be included in the first channel region CH1.

A drain region 230, doped with a second conductive dopant, is disposed at the lower portion of the active pattern 230. The lower surface of the drain region 235 may be disposed higher than the upper surface of the upper selection gate USGL. An inter-layer dielectric layer 240 may be disposed on the drain region 235 and the first inter-layer dielectric layer 217. A bit line 250, contacting the drain region 235, may be disposed on the second inter-layer dielectric layer 240. As illustrated in FIG. 4A, the bit line 250 crosses the upper selection gate USGL. The bit line 250 may be electrically connected to the drain region 235 via a bit line plug 245 that passes through the second inter-layer dielectric layer 245. A plurality of bit lines 250 may be disposed on the second inter-layer dielectric layer 240. The bit lines 250 may be extended in parallel in a second direction vertical to the first direction (i.e., the y-axis direction). The bit line 250 and the bit line plug 245 may be formed of the same materials as those of the bit line 180 and bit line plug 175 in FIG. 1B, respectively.

In the above-described semiconductor memory device, the lower selection gate LSGP controls the first and second channel regions CH1 and CH2. At this point, the first threshold voltage of the first channel region CH1 is different from the second threshold voltage of the second channel region CH2. Accordingly, a lower selection transistor including the lower selection gate LSGP and the first and second channel regions CH1 and CH2 can be optimized in characteristic. For example, the leakage current of the lower selection transistor can be minimized. As a result, a programming error is prevented, implementing high-reliability semiconductor memory devices.

FIGS. 5A through 5D are cross-sectional views taken along line II-II' in FIG. 4A for describing a method of fabricating a semiconductor memory device according to another embodiment of the inventive concept. FIG. 6 is a plan view for describing a method of forming a common source region in FIG. 5A.

Figure 5A:
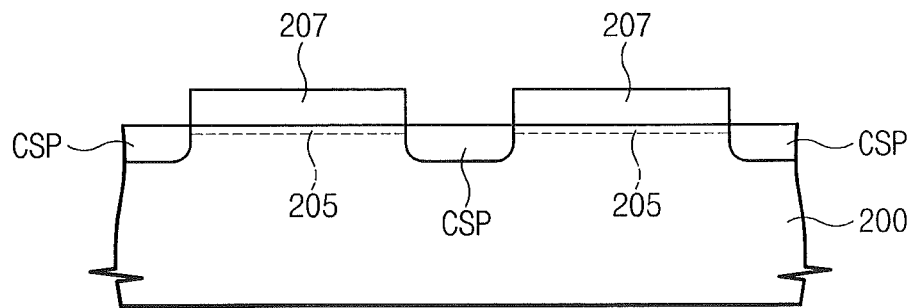
FIGS. 5A through 5D are cross-sectional views taken along line II-II' in FIG. 4A for describing a method of fabricating a semiconductor memory device according to another embodiment of the inventive concept.
Figure 6:
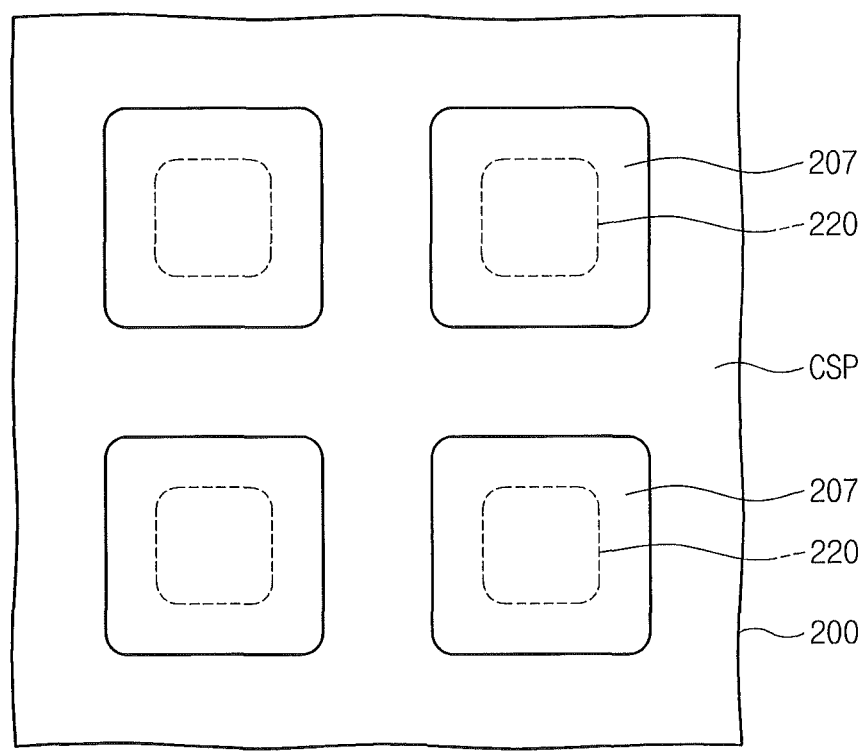
FIG. 6 is a plan view for describing a method of forming a common source region in FIG. 5A.

Referring to FIGS. 5A and 6, a semiconductor substrate 200 that is doped with a first conductive dopant is prepared. By forming a well region that is doped with the first conductive dopant at the semiconductor substrate 200, the semiconductor substrate 200 may be doped with the first conductive dopant. By injecting dopants for threshold voltage control into the surface of the semiconductor substrate 200, a surface doping layer 205 may be formed. The surface doping layer 205 is doped with the first conductive dopant. The dopant concentration of the surface doping layer 205 may be higher than that of the semiconductor substrate 200. In this case, the dopant for threshold voltage control may be the first conductive dopant. Unlike this, the dopant concentration of the surface doping layer 205 may be lower than that of the semiconductor substrate 200. In this case, by injecting a second conductive dopant as the dopant for threshold voltage control, a portion of the concentration of the first conductive dopant in the surface doping layer 205 may be offset. According to an embodiment of the inventive concept, forming the surface doping layer 205 may be omitted.

Subsequently, mask patterns 207 are formed on the semiconductor substrate 200. The mask patterns 207 are separated from each other. In FIG. 6, a dotted line 200 is a region in which the bottom surface of an opening is formed. The mask pattern 207 may cover the dotted line 220. Moreover, the mask pattern 207 may cover the semiconductor substrate 200 peripheral to the dotted line 220. The mask patterns 207 may be separated from each other and be two-dimensionally arranged along rows and columns.

Second conductive dopant ions are injected into the semiconductor substrate 200 by using the mask patterns 207 as a mask, a common source region CSP is formed. The mask patterns 207 may be formed of a photoresist, an oxide, a nitride and/or an oxynitride. The surface doping layer 205 under the mask patterns 207 may be left.

Figure 5B:
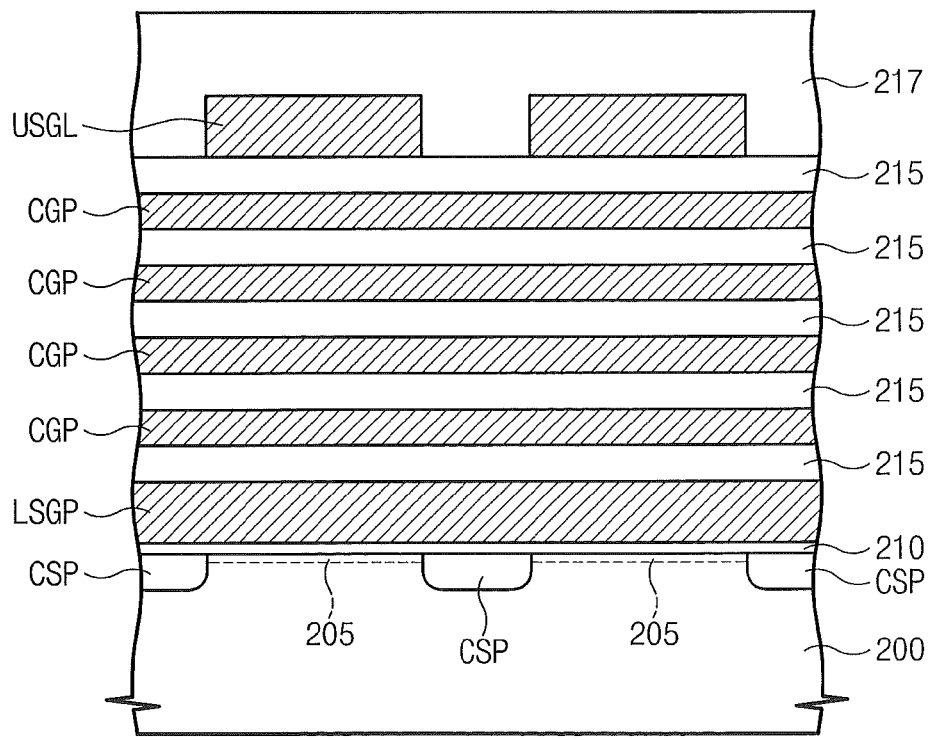

Referring to FIG. 5B, after forming the common source region CSP, the mask patterns 207 are removed. Subsequently, a first lower selection gate dielectric layer 210 is formed on the semiconductor substrate 200. A lower selection gate LSGP is formed on the first lower selection gate dielectric layer 210. The lower selection gate LSGP covers the common source region CSP and the surface doping layer 205. Inter-gate dielectric patterns 215 and cell gates CGP are alternately formed on the lower selection gate LSGP. Upper selection gates USGL are formed on the uppermost inter-gate dielectric pattern of the inter-gate dielectric patterns 215. Subsequently, a first inter-layer dielectric layer 217 is formed over the semiconductor substrate 200.

Figure 5C:
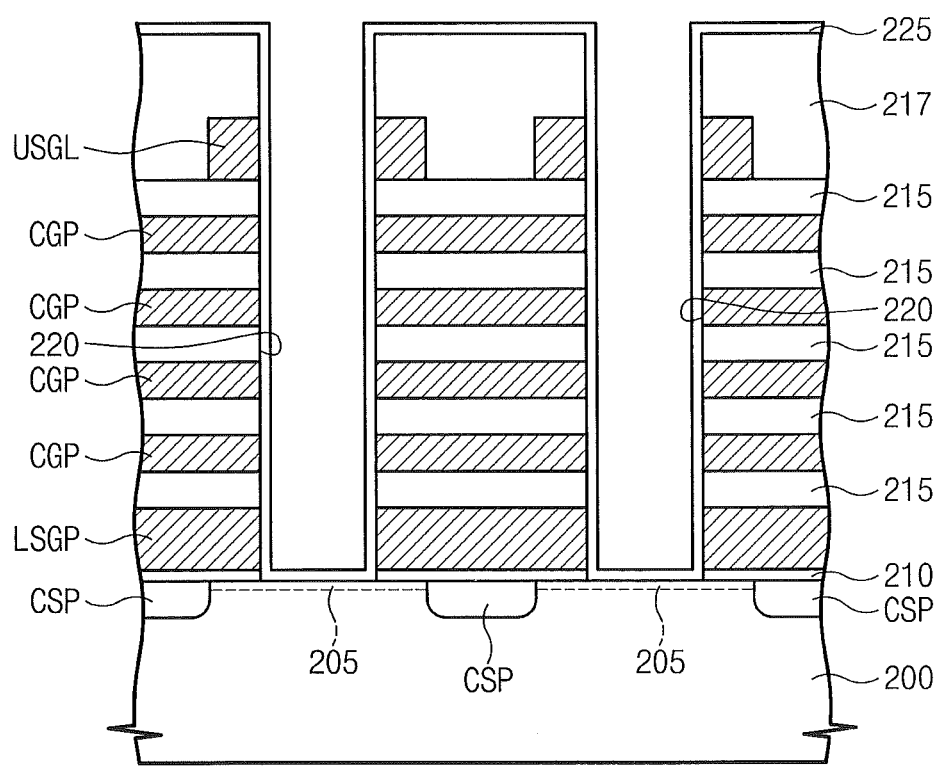

Referring to FIG. 5C, by continuously patterning the inter-layer dielectric layer 217, the upper selection gate USGL, the inter-gate dielectric patterns 215, the cell gates CGP, the lower selection gate LSGP and the first lower selection gate dielectric layer 210, an opening 220 for exposing the semiconductor substrate 200 is formed. The opening 220 exposes the semiconductor substrate 200 in which the common source region CSP is not formed. The opening 220 may be separated from the common source region CSP in parallel. The opening 220 is formed at the dotted line in FIG. 6.

Subsequently, a gate dielectric layer 225 is formed on the semiconductor substrate 200 of the opening 220. The gate dielectric layer 225 may be a triple layer including a tunnel dielectric layer, a charge trapping layer and a blocking dielectric layer. The tunnel dielectric layer, charge trapping layer and blocking dielectric layer of the gate dielectric 225 may be formed of the same materials as those of the tunnel dielectric layer, charge trapping layer and blocking dielectric layer of the data storage layer 125d in FIG. 1B, respectively. The gate dielectric layer 225 may be formed in a chemical vapor deposition process and/or an atomic layer deposition process. The gate dielectric layer 225 may be conformally formed on the upper surface of the first inter-layer dielectric layer 217 and the inner sidewall and bottom surface of the opening 220.

Figure 5D:
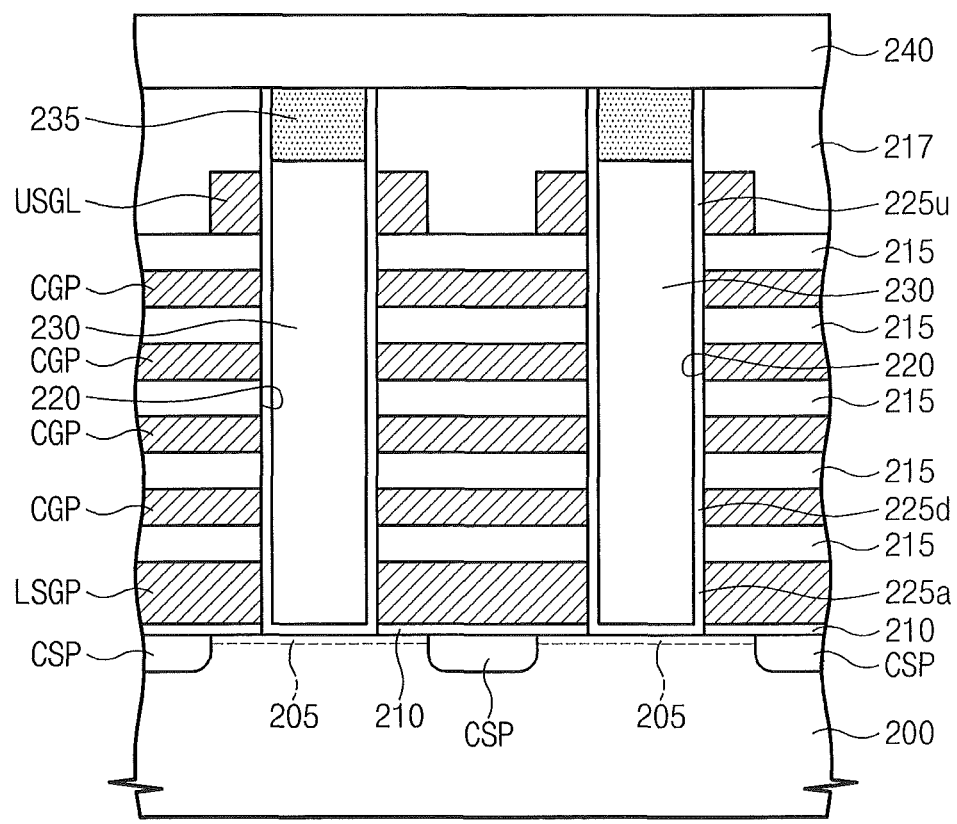

Referring to FIG. 5D, by removing the gate dielectric layer 225 on the bottom surface of the opening 220, the semiconductor substrate 200 is exposed. At this point, the gate dielectric layer 225 on the inner sidewall of the opening 220 is left. The gate dielectric layer 225 on the upper surface of the first inter-layer dielectric layer 217 may be removed together with the gate dielectric layer 225 on the bottom surface of the opening 220.

Subsequently, an active pattern 230 is formed in the opening 220. The active pattern 230 may contact the semiconductor substrate 200. The active pattern 230 is formed of periodic table group 4A element (or group 14 element). The active pattern 230 may be doped with the first conductive dopant or be in an intrinsic state in which it is not doped. A gate dielectric layer between the active pattern 230 and the lower selection gate LSGP is included in a second lower selection gate dielectric layer 225a, and a gate dielectric layer between the active pattern 230 and the cell gate CGP is included in a data storage layer 225d. A gate dielectric layer between the active pattern 230 and the upper selection gate USGL is included in an upper selection gate dielectric layer 225u.

By injecting a second conductive dopant into the upper portion of the active pattern 230, a drain region 235 is formed. Subsequently, a second inter-layer dielectric layer 240 may be formed over the semiconductor substrate 200. The bit line plug 245 (see FIG. 4B) that passes through the second inter-layer dielectric layer 240 is formed, and the bit line 250 in FIGS. 4A and 4B is formed on the second inter-layer dielectric layer 240. Consequently, the semiconductor memory device in FIGS. 4A and 4B can be fabricated.

Third Embodiment

A semiconductor memory device according to this embodiment may include a line shape of lower selection gate and a flat shape of cell gates. The semiconductor memory device according to this embodiment is similar to the semiconductor memory device according to the second embodiment. Accordingly, the same elements as those of the semiconductor memory device according to the second embodiment use like reference numerals, and the following description will be made on the feature contents of this embodiment.

Figure 7A:
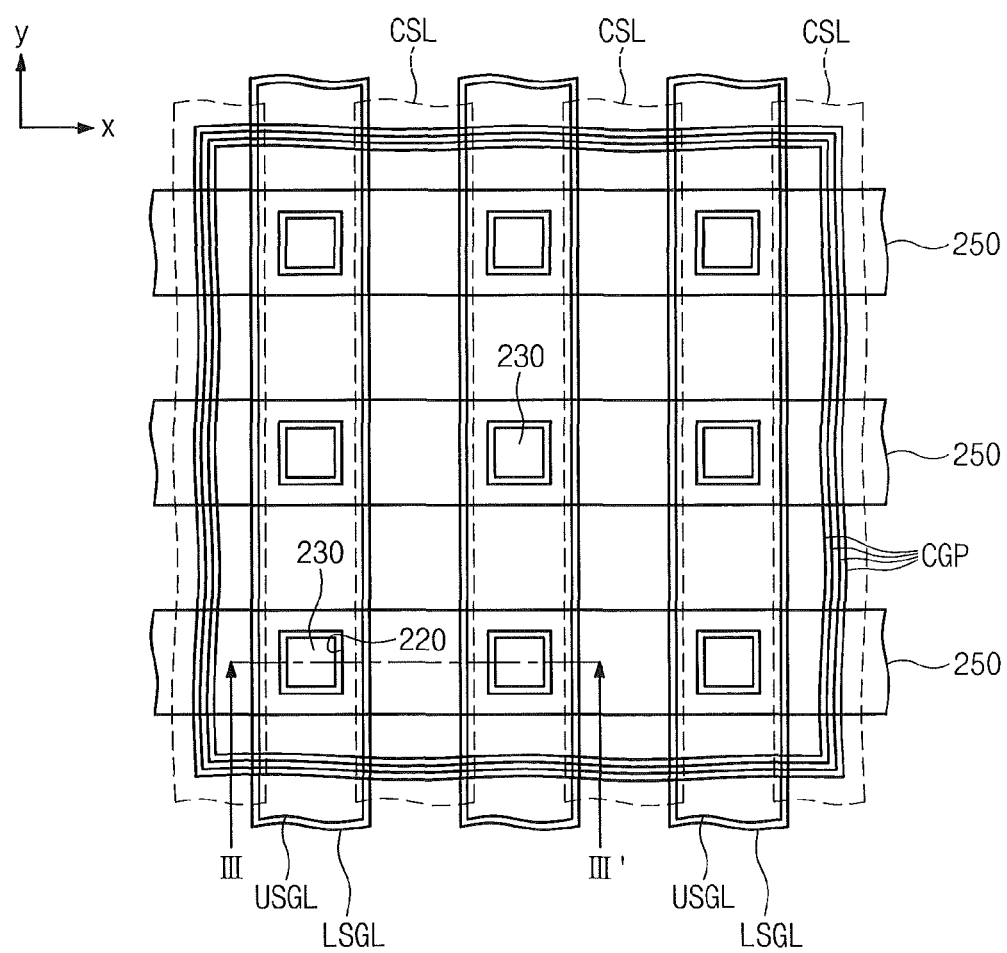
FIG. 7A is a plan view illustrating a semiconductor memory device according to another embodiment of the inventive concept.
Figure 7B:
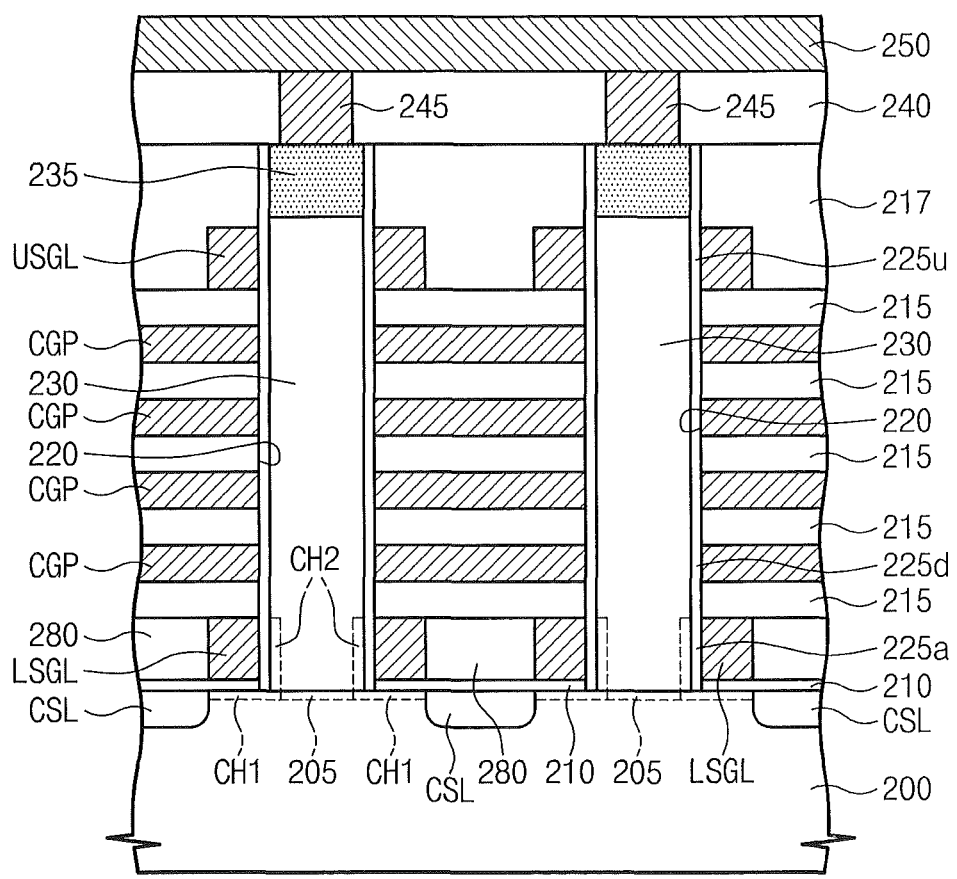
FIG. 7B is a cross-sectional view taken along line in FIG. 7A.

FIG. 7A is a plan view illustrating a semiconductor memory device according to another embodiment of the inventive concept. FIG. 7B is a cross-sectional view taken along line in FIG. 7A.

Referring to FIGS. 7A and 7B, a first lower selection gate dielectric layer 210 is disposed on a semiconductor substrate 200 that is doped with a first conductive dopant, and a plurality of lower selection gates LSGL are extended in a first direction in parallel, on the first lower selection gate dielectric layer 210. The first direction may correspond to the y-axis direction in FIG. 7A. The lower selection gates LSGL may have line shapes. The lower selection gates LSGL are separated from each other in parallel. A lower inter-layer dielectric layer 280 may be disposed between the lower selection gates LSGL. The upper surface of the lower inter-layer dielectric layer 280 and the upper surface of the lower selection gate LSGL may be coplanar. The lower selection gates LSGL may be formed of the same material as that of the lower selection gate LSGP in FIGS. 4A and 4B. The lower inter-layer dielectric layer 280 may be formed of an oxide, an oxynitride, a nitride and/or a carbide.

A common source region CSL is disposed at the semiconductor substrate 200 between the lower selection gates LSGL. The common source region CSL is doped with a second conductive dopant. The common source region CSL may have a line shape in which it is extended in the first direction in parallel to the lower selection gate LSGL.

Inter-gate dielectric patterns 215 and cell gates CGP are alternately stacked on the lower selection gates LSGL and the lower inter-layer dielectric layer 280. An upper selection gates USGL are disposed on the uppermost inter-gate dielectric pattern of the inter-gate dielectric patterns 215. The upper selection gates USGL are extended in the first direction in parallel. The upper selection gates USGL may be disposed at the upper portions of the lower selection gates LSGL, respectively. The stacked lower and upper selection gates LSGL and USGL may overlap. A first inter-layer dielectric layer 217 is disposed on the upper selection gates USGL and the cell gates CGP.

The active pattern 230 is disposed in an opening 220 that continuously passes through the upper selection gate USGL, the cell gates CGP, the inter-gate dielectric patterns 215, the lower selection gate LSGL and the first lower selection gate dielectric layer 210. The active pattern 230 may contact the semiconductor substrate 200. A plurality of active patterns 230 are two-dimensionally arranged along rows and columns on the semiconductor substrate 200. A data storage layer 225d is disposed between the active pattern 230 and the cell gate CGP, and an upper selection gate dielectric layer 225u is disposed between the active pattern 230 and the upper selection gate USGL. A second lower selection gate dielectric layer 225a is disposed between the active pattern 230 and the lower selection gate LSGL.

The lower selection gate LSGL defines a second channel region CH2 that is defined at the lower portion of the active pattern 230 next to the lower selection gate LSGL and a first channel region CH1 that is defined at the semiconductor substrate 200 under the lower selection gate LSGL. The characteristics of the first and second channel regions CH1 and CH2 are the same as those of the first and second channel regions CH1 and CH2 in FIGS. 4A and 4B.

The lower selection gates LSGL may be independently controlled. That is, different operation voltages may be applied to the lower selection gates LSGL, respectively.

A drain region 235, doped with a second conductive dopant, may be disposed on the upper portion of the active pattern 230, and a second inter-layer dielectric layer 240 may be disposed on the drain region 235 and the first inter-layer dielectric layer 217. Bit lines 250 are disposed on the second inter-layer dielectric layer 240, and the bit line 250 may be electrically connected to the drain region 235 via a bit line plug 245 that passes through the second inter-layer dielectric layer 240. The bit line 250 is extended in a second direction (for example, the x-axis direction in FIG. 7A) vertical to the first direction.

According to the above-described semiconductor device, the cell gates CGP have flat shapes, and the lower and upper selection gates LSGL and USGL have line shapes in which they are extended in parallel. The lower selection gate LSGL controls the first and second channel regions CH1 and CH2. The first and second channel regions CH1 and CH2 have different threshold voltages. For example, the absolute value of the first threshold voltage of the first channel region CH1 may be greater than that of the second threshold voltage of the second channel region CH2. Consequently, a lower selection transistor including the lower selection gate LSGL can be optimized in characteristic, and thus high-reliability semiconductor memory devices can be implemented.

Moreover, the lower selection gates LSGL are formed in a line shape and are separated from each other. Therefore, the lower selection gates LSGL may be independently controlled. As a result, the reading error of the semiconductor memory device can be prevented.

FIGS. 8A through 8D are cross-sectional views taken along line in FIG. 7A for describing a method of fabricating a semiconductor memory device according to another embodiment of the inventive concept.

Figure 8A:
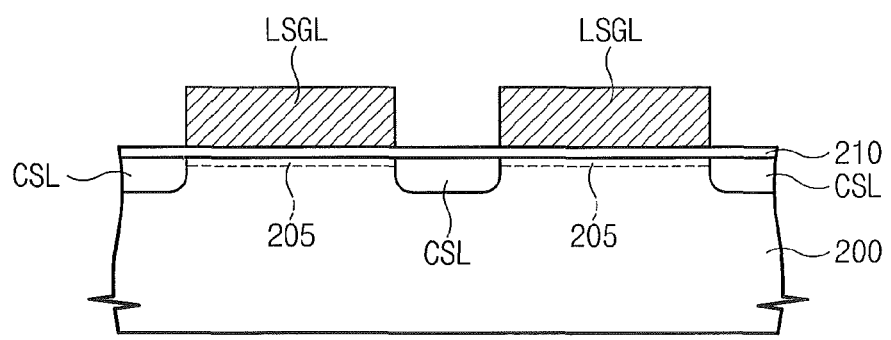
FIGS. 8A through 8D are cross-sectional views taken along line in FIG. 7A for describing a method of fabricating a semiconductor memory device according to another embodiment of the inventive concept.

Referring to FIG. 8A, a surface doping layer 205 may be formed at the surface of the semiconductor substrate 200 that is doped with a first conductive dopant. A method for forming the surface doping layer 205 is the same as one that has been described above with reference to FIG. 5A.

A first lower selection gate dielectric layer 210 is formed on the semiconductor substrate 200, and a line shape of lower selection gates LSGL are formed in parallel on the first lower selection gate dielectric layer 210. A second conductive dopant is injected by using the lower selection gates LSGL as a mask, a common source region CSL is formed. The common source region CSL is self-aligned and formed at the lower selection gates LSGL. Accordingly, the common source region CSL may be formed in a line shape where it is extended in parallel to the lower selection gates LSGL.

Figure 8B:
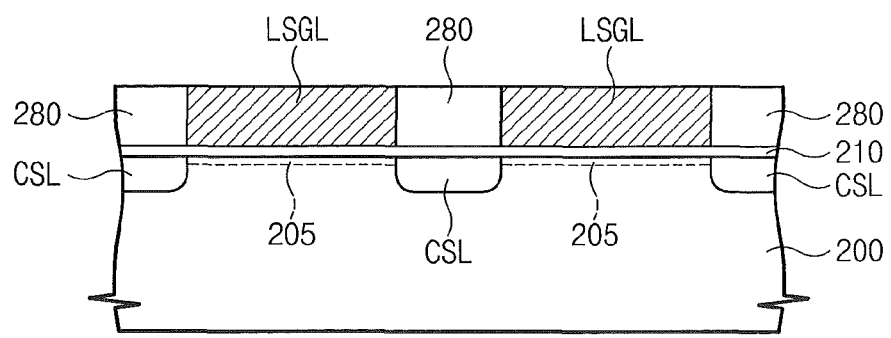

Referring to FIG. 8B, a lower inter-layer dielectric layer 280 is formed on the semiconductor substrate 200 having the common source region CSL. The lower inter-layer dielectric layer 280 may fill regions between the lower selection gates LSGL. The lower inter-layer dielectric layer 280 may be planarized until the lower selection gates LSGL is exposed.

Figure 8C:
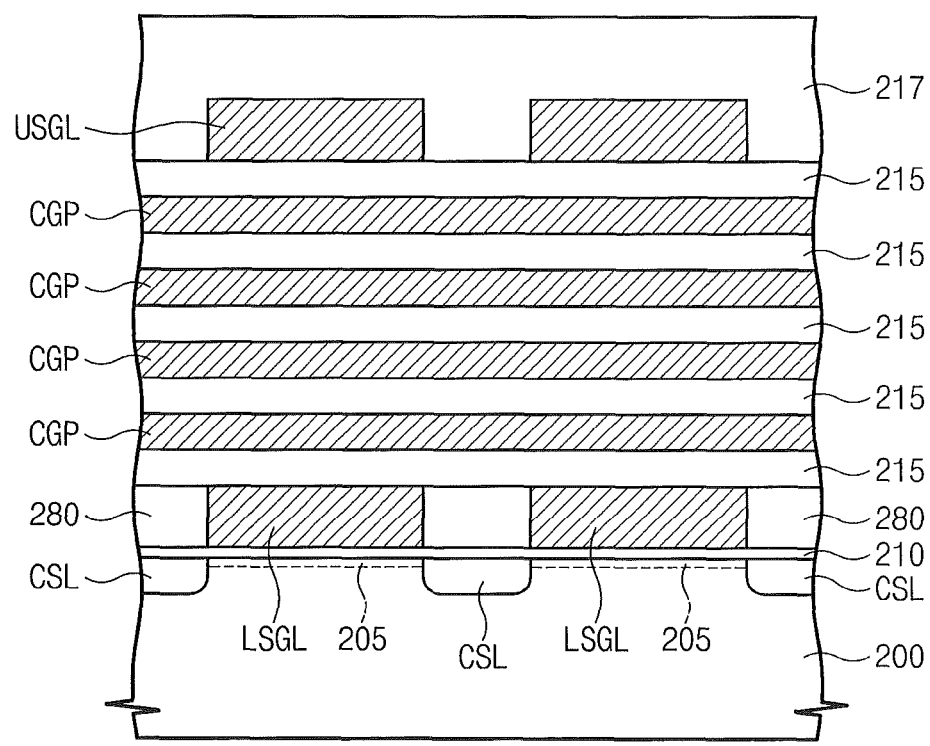

Referring to FIG. 8C, the planarized lower inter-layer dielectric layer 280 is formed, and inter-gate dielectric patterns 215 and cell gates CGP that are alternately stacked on lower selection gates LSGL are formed. The inter-gate dielectric patterns 215 and the cell gates CGP may be formed in a flat shape.

An upper selection gates USGL is formed on an uppermost inter-gate dielectric pattern of the inter-gate dielectric patterns 215. The upper selection gates USGL are extended in parallel to the lower selection gates LSGL. The upper selection gates USGL may overlap with the upper portion of the lower selection gates LSGL, respectively. Subsequently, a first inter-layer dielectric layer 217 is formed on a semiconductor substrate 200.

Figure 8D:
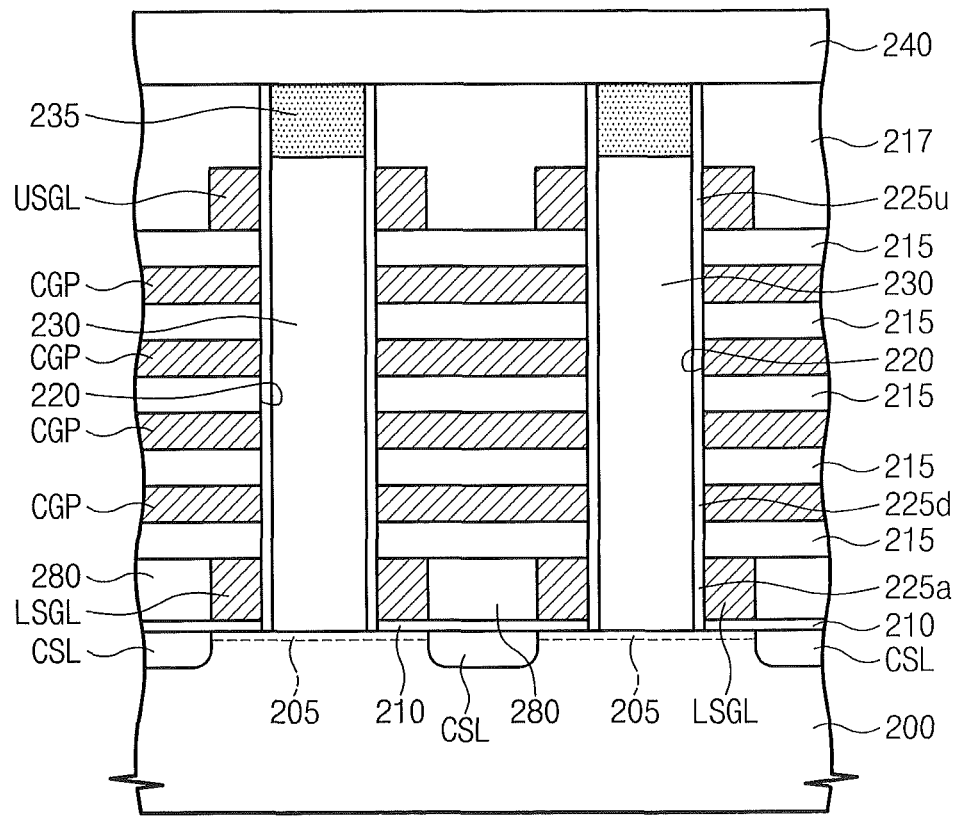

Referring to FIG. 8D, by continuously patterning the first inter-layer dielectric layer 217, the upper selection gate USGL, the cell gates CGP, the inter-gate dielectric patterns 215, the lower selection gate LSGL and the first lower selection gate dielectric layer 210, an opening 220 is formed. A plurality of openings 220 may be two-dimensionally arranged on the semiconductor substrate 200.

Subsequently, a gate dielectric layer is conformally formed, and a gate dielectric layer on the bottom surface of the opening 220 is removed. At this point, a gate dielectric layer on the inner sidewall of the opening 220 is left. The gate dielectric layer may be formed of the same material as that of the gate dielectric layer 225 in FIG. 5C.

An active pattern 230 is formed in the opening 220. The active pattern 230 may contact the semiconductor substrate 200. By injecting a second conductive dopant into the upper portion of the active pattern 230, a drain region 235 is formed. Subsequently, a second inter-layer dielectric layer 240 may be formed on the semiconductor substrate 200. The bit line plug 245 and bit line 250 in FIG. 7B may be formed. Accordingly, the semiconductor memory device in FIGS. 7A and 7B can be implemented.

The above-described semiconductor memory devices according to first to third embodiments may be implemented in various types of semiconductor packages. For example, the semiconductor memory devices according to embodiments of the inventive concept may be packaged in a package type such as Package on Package (PoP), Ball Grid Arrays (BGA), Chip Scale Packages (CSP), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), Die On Waffle Package (DOWP), Wafer Level Stack Package (WISP), Die In Wafer Form (DIWF) and Wafer-Level Processed Stack Package (WSP). A package on which a semiconductor memory device according to embodiments of the inventive concept is mounted may further include at least one logic device and/or a controller for controlling the semiconductor memory device.

Figure 9:
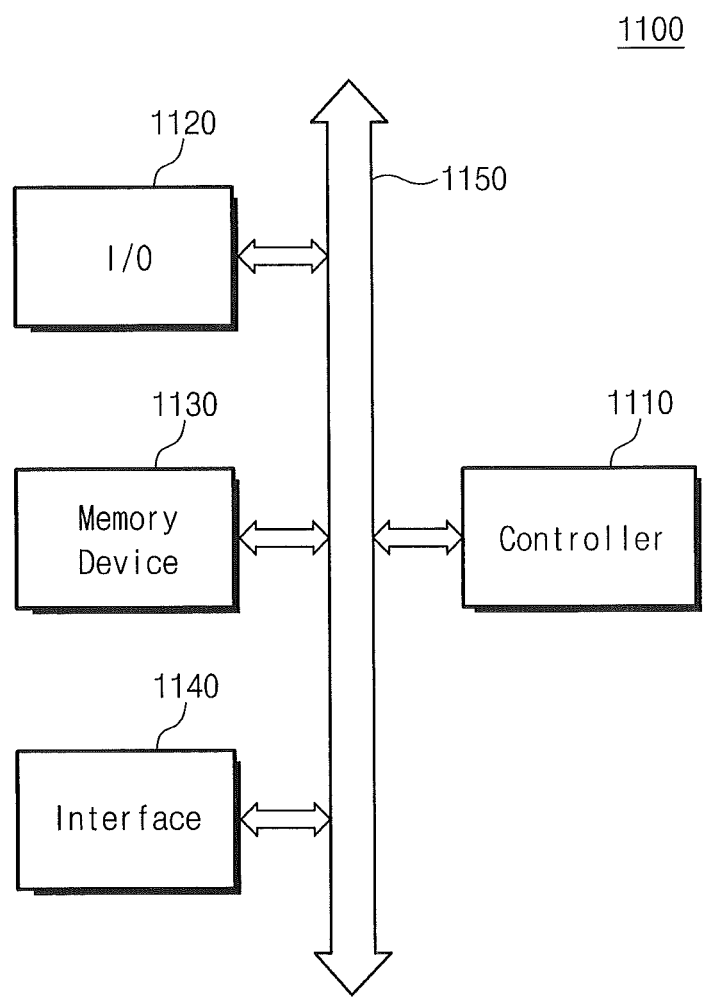
FIG. 9 is a block diagram illustrating an electronic system which includes a semiconductor memory device according to embodiments of the inventive concept.

FIG. 9 is a block diagram illustrating an electronic system which includes a semiconductor memory device according to embodiments of the inventive concept.

Referring to FIG. 9, an electronic system 110 according to an embodiment of the inventive concept includes a controller 1110, an input/output device 1120, a memory device 1130, an interface 1140, and a bus 1150. The controller 1110, the input/output device 1120, the memory device 1130 and/or the interface 1140 may be connected through the bus 1150. The bus 1150 corresponds to a path through which data move.

The controller 1110 may include at least one of a microprocessor, a digital signal processor, a micro-controller and logic devices of performing functions similar to their functions. The input/output device 1120 may include a keypad, a keyboard and a display device. The memory device 1130 may store data and/or commands. The memory device 1130 may include at least one of the semiconductor memory devices that have been disclosed in first to third embodiments. Moreover, the memory device 1130 may further include other types of semiconductor memory devices (for example, Phase-change Random Access Memory (PRAM), Magnetoresistive Random Access Memory (MRAM), Dynamic Random Access Memory (DRAM) and/or Static Random Access Memory (SRAM)). The interface 1140 may transmit data to a communication network or receive data from the communication network. The interface 1140 may have a wired type or a wireless type. For example, the interface 1140 may include an antenna or a wired/wireless transceiver. Although not shown, the electronic system 110 is an operation memory for improving the operation of the controller 1110, and may further include high-speed DRAM and/or SRAM.

The electronic system 1100 may be applied to a Personal Digital Assistant (PDA), a portable computer, a web tablet, a wireless phone, a mobile phone, a digital music player, a memory card or all electronic devices that can transmit and/or receive information in wireless environment.

Figure 10:
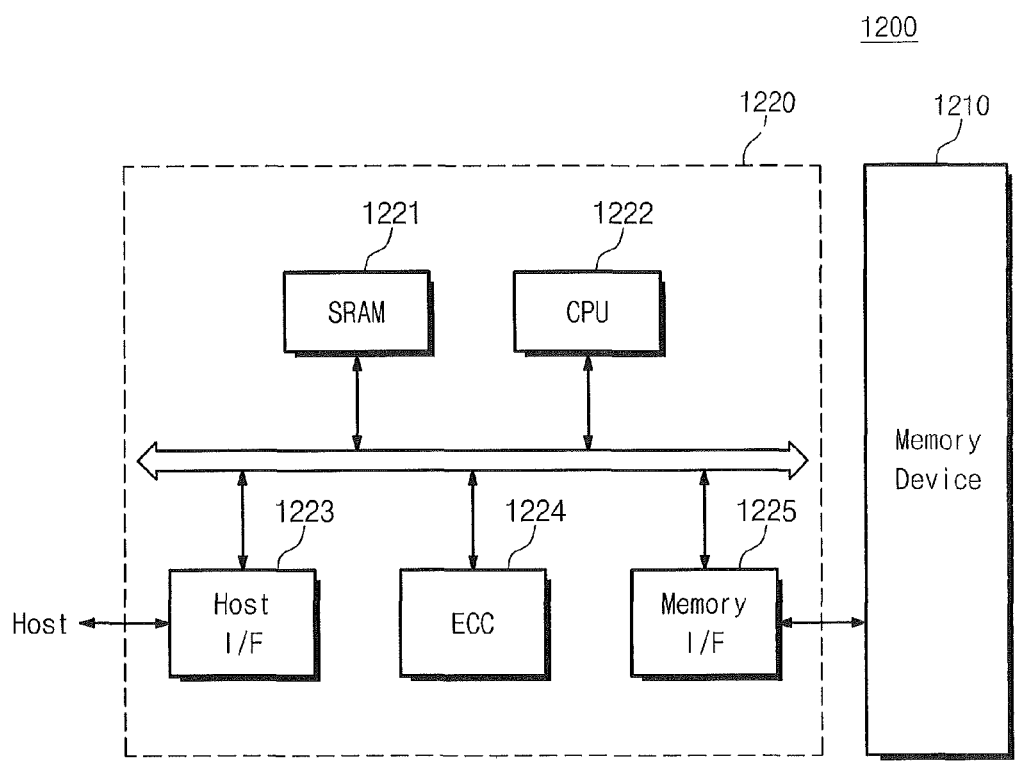
FIG. 10 is a block diagram illustrating a memory card which includes a semiconductor memory device, according to an embodiment of the inventive concept.

FIG. 10 is a block diagram illustrating a memory card which includes a semiconductor memory device, according to an embodiment of the inventive concept.

Referring to FIG. 10, a memory card 1200 according to an embodiment of the inventive concept includes a memory device 1210. The memory device 1210 may include at least one of the semiconductor memory devices that have been disclosed in first to third embodiments. Moreover, the memory device 1210 may further include other types of semiconductor memory devices (for example, PRAM, MRAM, DRAM and/or SRAM). The memory card 1200 may include a memory controller 1220 for controlling data exchange between a host and the memory device 1210.

The memory controller 1220 may include a Central Processing Unit (CPU) 1222 that controls the overall operation of the memory card. Moreover, the memory controller 1220 may include an SRAM 1222 that is used as the operation memory of the CPU 1222. Furthermore, the memory controller 1120 may further include a host interface 1223 and a memory interface 1225. The host interface 1223 may include a data exchange protocol between the memory card 1200 and the host. The memory interface 1225 may connect the memory controller 1220 and the memory device 1210. In addition, the memory controller 1220 may further include an Error Correction Code (ECC) block 1224. The ECC block 1224 may detect and correct the error of data that are read from the memory device 1210. Although not shown, the memory card 1200 may further include a Read Only Memory (ROM) that stores code data for interfacing with the host. The memory card 1200 may be used as a portable data storage card. Unlike this, the memory card 1200 may be implemented with a Solid State Disk (SSD) that may replace the hard disk of a computer system.

According to embodiments of the inventive concept, the lower selection gate controls the first channel region that is defined at the semiconductor substrate and the second channel region that is defined at the lower portion of the active pattern. The first threshold voltage of the first channel region is different from the second threshold voltage of the second channel region. Accordingly, the characteristic of the lower selection transistor including the lower selection gate can be optimized. Moreover, the absolute value of the first threshold voltage of the first channel region may be greater than the second threshold voltage of the second channel region. Therefore, the leakage current of the lower selection transistor can be minimized. As a result, the programming error and/or reading error of the semiconductor memory device are prevented, fabricating high-reliability semiconductor memory devices.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor memory device, comprising:
   an active pattern disposed on a semiconductor substrate, and extended toward a direction far away from the semiconductor substrate; and
   a lower selection gate controlling a first channel region that is defined at the semiconductor substrate and a second channel region that is defined at a lower portion of the active pattern,
   wherein a first threshold voltage of the first channel region is different from a second threshold voltage of the second channel region.

2. The semiconductor memory device of claim 1, wherein an absolute value of the first threshold voltage is greater than an absolute value of the second threshold voltage.

3. The semiconductor memory device of claim 2, wherein a dopant concentration of the first channel region is higher than a dopant concentration of the second channel region.

4. The semiconductor memory device of claim 1, further comprising a common source region formed in the semiconductor substrate of a side of the first channel region.

5. The semiconductor memory device of claim 4, wherein the lower selection gate runs parallel with the common source region along one direction.

6. The semiconductor memory device of claim 1, further comprising:
   inter-gate dielectric patterns and cell gates alternately stacked on the lower selection gate, the inter-gate dielectric patterns and the cell gates having respective one sidewalls adjacent to a sidewall of the active pattern;
   a data storage layer disposed between each of the cell gates and the active pattern; and
   an upper selection gate disposed on an uppermost inter-gate dielectric pattern of the inter-gate dielectric patterns, the upper selection gate having a one sidewall adjacent to the active pattern.

7. The semiconductor memory device of claim 6, further comprising:
   a first lower selection gate dielectric layer between the semiconductor substrate and the lower selection gate;
   a second lower selection gate dielectric layer between the active pattern and the lower selection gate; and
   an upper selection gate dielectric layer between the active pattern and the upper selection gate,
   wherein at least the second lower selection gate dielectric layer and the upper selection gate dielectric layer comprise the same material as material of the data storage layer.

8. The semiconductor memory device of claim 6, further comprising:
   a drain region formed in an upper portion of the active pattern; and
   a bit line electrically connected to the drain region,
   wherein the upper selection gate is extended in one direction parallel to an upper surface of the semiconductor substrate, and the bit line crosses the upper selection gate.

9. The semiconductor memory device of claim 6, wherein the lower selection gate and the cell gates have line shapes which are extended in parallel to the upper selection gate.

10. The semiconductor memory device of claim 6, wherein:
   the cell gates and the inter-gate dielectric patterns have flat shapes, and
   the active pattern is disposed in a hole which passes through the cell gates and the inter-gate dielectric patterns.

* * * * *